US010117369B2

(12) United States Patent
Nishiyama

(10) Patent No.: US 10,117,369 B2
(45) Date of Patent: Oct. 30, 2018

(54) COMPONENT TRANSFER DEVICE OF COMPONENT MOUNTER

(71) Applicant: FUJI CORPORATION, Chiryu (JP)

(72) Inventor: Satoru Nishiyama, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 184 days.

(21) Appl. No.: 14/906,827

(22) PCT Filed: Jul. 24, 2013

(86) PCT No.: PCT/JP2013/070084
§ 371 (c)(1),
(2) Date: Jan. 21, 2016

(87) PCT Pub. No.: WO2015/011805
PCT Pub. Date: Jan. 29, 2015

(65) Prior Publication Data
US 2016/0165771 A1   Jun. 9, 2016

(51) Int. Cl.
*H05K 13/04* (2006.01)
(52) U.S. Cl.
CPC .............................. *H05K 13/0408* (2013.01)
(58) Field of Classification Search
CPC ............... B25J 15/0061; B25J 15/0616; B25J 15/0625; B25J 15/0633; B25J 15/0641; B25J 15/065; B25J 15/0658; B25J 15/0666; B25J 15/0675; B65G 47/912; B65G 47/914; B65G 47/918; H05K 13/0408; Y10T 29/53178; Y10T 29/53191
USPC ..................... 29/743; 414/737, 752.1; 901/40
See application file for complete search history.

(56) References Cited

U.S. PATENT DOCUMENTS

| 6,328,362 B1 | 12/2001 | Isogai et al. |
| 2003/0014862 A1 | 1/2003 | Suhara et al. |
| 2012/0151756 A1* | 6/2012 | Amano ............ H05K 13/0413 29/720 |

FOREIGN PATENT DOCUMENTS

| EP | 1 075 174 A1 | 2/2001 |
| JP | 9-167898 A | 6/1997 |
| JP | 2006-261371 | 9/2006 |
| JP | 2008-72066 A | 3/2008 |

(Continued)

OTHER PUBLICATIONS

Extended European Search Report dated Jul. 8, 2016 in Patent Application No. 13890079.0.

(Continued)

*Primary Examiner* — Saul Rodriguez
*Assistant Examiner* — Brendan P Tighe
(74) *Attorney, Agent, or Firm* — Oblon, McClelland, Maier & Neustadt, L.L.P.

(57) ABSTRACT

A component mounter is provided with a single nozzle head and multiple nozzle heads which are automatically exchangeable, a pickup/mounting driving section that connects to a suction nozzle of a single nozzle head held on a head holding section and a selected suction nozzle of a multiple nozzle head held on the head holding section and that raises/lowers the internal pressure of the suction nozzle. The pickup/mounting driving device, when making the suction nozzle of the held single nozzle head mount a component, cuts off the suction nozzle from a negative pressure source and connects the suction nozzle to a positive pressure source and the atmosphere.

8 Claims, 15 Drawing Sheets

(56) References Cited

FOREIGN PATENT DOCUMENTS

JP    2008-226978 A    9/2008

OTHER PUBLICATIONS

International Search Report dated Sep. 3, 2013 in PCT/JP2013/070084 filed Jul. 24, 2013.

* cited by examiner

COMPONENT TRANSFER DEVICE OF COMPONENT MOUNTER

TECHNICAL FIELD

The present disclosure relates to a component transfer device of a component mounter that mounts components on a board, specifically, an automatic head exchange type component transfer device that automatically exchanges a single nozzle head and a multiple nozzle head.

BACKGROUND ART

Equipment such as solder printers, component mounters, and reflow ovens is used to produce printed circuit boards mounted with many components, and in many cases the equipment is linked together to configure a board production line. Among this equipment, component mounters provided with a board conveyance device, a component supply device, and a component transfer device are typical. Board conveyance devices load and unload printed circuit boards and hold circuit boards in position. Component supply devices sequentially supply multiple types of components to a specified supply position. Component transfer devices are provided with a suction nozzle that picks up a component from a supply position of a component supply device using negative pressure, and a head driving section that drives a mounting head that holds the suction nozzle.

For the component transfer device above, in order to improve mounting efficiency, technology for manual exchange of multiple types of mounting heads with a different quantity of suction nozzles is typical. Further, automatic head exchange type component transfer devices that automatically exchange multiple types of mounting heads have also been realized. As types of mounting heads to be exchanged, there are single nozzle heads that have one suction nozzle, and multiple nozzle heads that have multiple suction nozzles. Multiple nozzle heads are also referred to as rotary heads, wherein multiple suction nozzles are selected in order by being revolved such that pickup of components and mounting them onto a board is performed in order.

An example of technology related to this type of component transfer device is disclosed in patent literature 1. The component supply device of patent literature 1 is provided with multiple types of component supply tools (mounting heads), multiple holding means (head holding sections) that detachably hold a component supply tool, and a movement operation means (head driving device) that supplies a component of a component supply tool to a target item by separately moving the multiple holding means. Further, an embodiment is disclosed in which, as well as a component supply tool holding a component by suction force, a holding means holds a component supply tool by magnetic attraction, air suction force, or the like. By this, the component supply tool is detachably held by the holding means.

CITATION LIST

Patent Literature

Patent Literature 1: JP-A-9467898

SUMMARY

However, a pickup/mounting driving section that drives pickup operation and mounting operation of a suction nozzle of a component transfer device opens/closes a valve to raise/lower internal pressure of the suction nozzle, and selectively connects the suction nozzle with one of a negative pressure source or a positive pressure source. With a component transfer device with which multiple types of mounting head are exchanged manually, each mounting head is internally equipped with a quantity of pickup/mounting driving sections appropriate for the quantity of suction nozzles. Thus, the responsiveness when raising the internal pressure of a suction nozzle is good and mounting operation is performed efficiently regardless of the type of mounting head. In contrast, with an automatic head exchange type component transfer device that automatically exchanges a single nozzle head and a multiple nozzle head, the head holding section is provided with a pickup/mounting driving section for which at least a portion is common for each mounting head. Due to this, the responsiveness is reduced when changing negative pressure to positive pressure in a single nozzle head to mount a component on a board, leading to a problem in which the time required for mounting is increased.

Specifically, with a single nozzle head exchanged manually, when raising the pressure, positive pressure is supplied from a positive pressure source while allowing negative pressure to escape by letting in atmospheric pressure with a negative pressure valve that cuts off the single nozzle head from the negative pressure source. By this, the responsiveness of raising pressure is better compared to only using a positive pressure source. However, with a single nozzle head that is exchanged automatically, it is not possible to allow atmospheric pressure to enter while raising the pressure, so the responsiveness when raising the pressure drops. This is because if a function to allow the entry of atmospheric pressure during raising pressure is added to the head holding section, when automatically exchanging a multiple nozzle head, there is a worry that a specified level of positive pressure will no longer be maintained. This worry depends on the internal configuration of the multiple nozzle head and the head holding section, and the characteristics of the positive pressure source. For example, on the one hand, the greater the quantity of suction nozzles, the more positive pressure air is required; but on the other hand, if the supply amount of positive pressure air is limited by the positive pressure source having a regulator, there is a tendency for the above problem to be exacerbated.

Note that, the problem of responsiveness dropping and the time required for mounting becoming longer when raising pressure with a single nozzle head that is exchanged automatically is not limited to an automatic head exchange type component transfer device that uses magnetic attraction or air suction force as disclosed in patent literature 1. In other words, this problem also arises in the same way in automatic head exchange type component transfer devices that automatically exchange mounting heads using a mechanical mechanism such as a locking member.

The present disclosure takes account of the above problem and an object thereof is to provide a component transfer device of a component mounter that shortens the time required for mounting and makes the responsiveness good when raising the internal pressure of a suction nozzle of a single nozzle head that is exchanged automatically.

The present disclosure is directed to a component transfer device of a component mounter comprising: a single nozzle head that has one suction nozzle which picks up a component from a supply position by making the internal pressure of the suction nozzle negative and mounts the component on a board held at a fixed position by raising the internal pressure of the suction nozzle; a multiple nozzle head that has multiple suction nozzles; a head holding section that exchangeably holds the single nozzle head and the multiple nozzle head; a pickup/mounting driving section provided on the head holding section that connects with the suction nozzle of the held single nozzle head and a selected suction nozzle of the held multiple nozzle head, and raises/lowers the internal pressure of the suction nozzle; and a head driving section that drives the head holding section and the held single nozzle head or the held multiple nozzle head between the supply position and the board held at a fixed position; wherein the pickup/mounting driving device, when making the suction nozzle of the held single nozzle head perform mounting of the component, cuts off the suction nozzle from a negative pressure source, connects the suction nozzle to a positive pressure source, and connects the suction nozzle to the atmosphere.

According to this, when making the suction nozzle of the single nozzle head held by the head holding section mount a component, the pickup/mounting driving section cuts off the suction nozzle from a negative pressure source, connects the suction nozzle to a positive pressure source, and connects the suction nozzle to the atmosphere. By connecting the suction nozzle to the atmosphere, outside air is introduced such that the negative pressure rises, with the internal pressure of the suction nozzle rising rapidly for a while, and then rising in accordance with the positive pressure from the positive pressure source. In other words, introducing outside air assists for a while the pressure rising effect from the positive pressure source. This makes the responsiveness good when the internal pressure of the suction nozzle is being raised, which reduces the time required for mounting.

DETAILED DESCRIPTION

Figure 1:
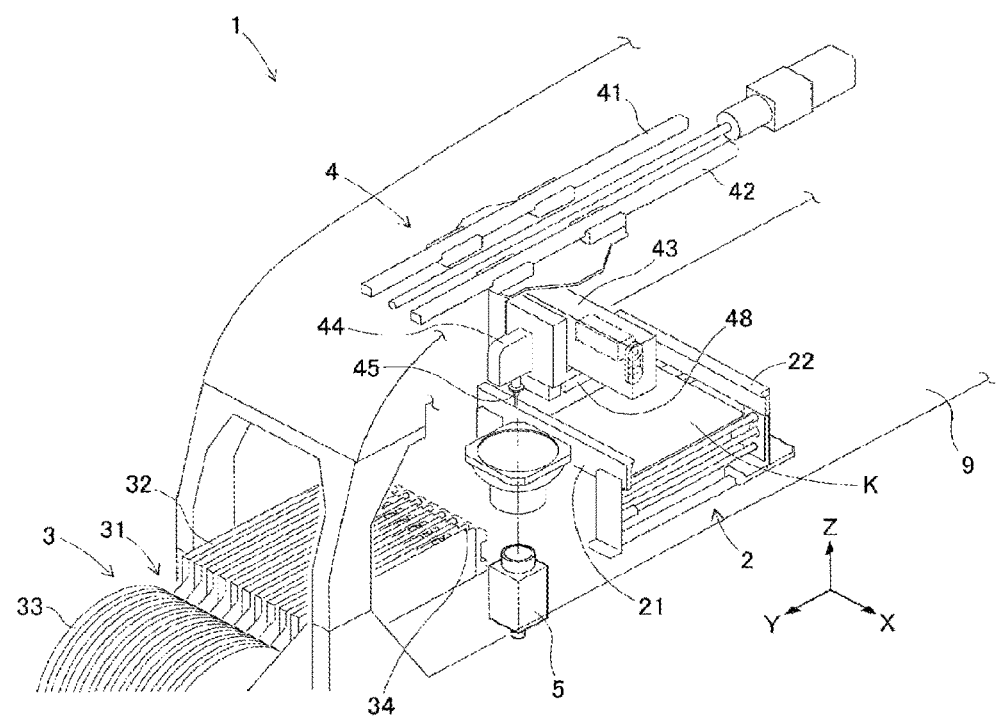
FIG. 1 is a perspective view illustrating the overall configuration of a component mounter including the component transfer device of a first embodiment.

Component transfer device 4 of component mounter 1 of a first embodiment of the present disclosure is described below with reference to FIGS. 1 to 10. FIG. 1 is a perspective view illustrating the overall configuration of component mounter 1 including component transfer device 4 of the first embodiment. Component mounter 1 is an automatic head exchange type machine and is configured from board conveyance device 2, component supply device 3, component transfer device 4, and component camera 5 assembled to base 9. Devices 2 to 5 are controlled from a control computer which is not shown such that each performs specified work.

Board conveyance device 2 loads board K to a mounting position, fixes board K in position, and unloads board K. Board conveyance device 2 is configured from items such as first and second guide rails 21 and 22, a pair of conveyor belts, and a clamping device. First and second guide rails 21 and 22 extend in the conveyance direction (X-axis direction) crossing the central upper portion of base 9, and are assembled on base 9 so as to be parallel to each other. A pair of conveyor belts (not shown) are arranged parallel to each other on the inside of first and second guide rails 21 and 22. The conveyor belts revolve with board K in contact with the conveyance surface of the conveyor belts and load/unload board K to/from a mounting position set in a center section of base 9.

A clamping device (not shown) is provided below the conveyor belts at the mounting position. The clamping device pushes up board K and clamps it in a horizontal state so as to fix it at the mounting position. This allows component transfer device 4 to perform mounting operation at the mounting position.

Component supply device 3 supplies multiple types of components. Component supply device 3 is a feeder type device provided on the front (the left front side in FIG. 1) of component mounter 1 in a lengthwise direction. Component supply device 3 has many cassette type feeders 31 which are attachable/detachable. Cassette type feeder 31 is provided with main body 32, supply reel 33 provided on a rear portion of main body 32, and component take-out section 34 provided on the front end of main body 32. Long, thin tape (not shown) in which many components are stored at a specified pitch is wound around reel 33; this tape is indexed at a specified pitch by a sprocket (not shown) such that components are revealed and delivered sequentially to component takeout section 34.

Component transfer device 4 picks up a component from component take-out section 34 of component supply device 3, moves the component to board K held at a fixed position and mounts the component on the board K. Component transfer device 4 is an XY robot type device that is capable of moving horizontally in the X-axis direction and the Y-axis direction. Component transfer device 4 is configured from a pair of Y-axis rails 41 and 42, Y-axis slide 43, head holding section 44, single nozzle head 45, and two types of multiple nozzle heads 46 and 47, and the like, and includes pickup/mounting driving section 6 which is described below.

The pair of Y-axis rails 41 and 42 are provided in a lengthwise direction from the rear section of base 9 (the right rear side in FIG. 1) to above component supply device 3 which is on the front section of base 9. Y-axis slider 43 is mounted on Y-axis rails 41 and 42 so as to be movable in the Y-axis direction. Head holding section 44 is mounted on Y-axis slider 43 so as to be movable in the X-axis direction. Single nozzle head 45 and two types of multiple nozzle heads 46 and 47 are exchangeably held on the lower side of head holding section 44. Head holding section 44 is driven horizontally in two directions (X and Y) by two servo motors. The two servo motors, Y-axis rails 41 and 42, Y-axis slider 43, and the like form the head driving section.

Also, board camera 48 that images board K is provided facing downwards on the bottom surface of Y-axis slider 43. Board camera 48 reads fiducial marks on board K held at a fixed position and detects variance in the fixed position of board K. By this, coordinates on board K are calibrated and control of the mounting position of components is performed accurately.

Component camera 5 is provided facing upwards on an upper surface of base 9 between board conveyance device 2 and component supply device 3. Component camera 5 detects the state of a picked up component by imaging the component as it is moved from component supply position 3 to above board K by each head 45 to 47. After component camera 5 detects the deviation in the pickup position and rotation and so on of the component, fine adjustments of component mounting operation are performed as necessary, with components for which mounting is difficult being rejected.

Component mounter 1 is provided with a control computer not shown in the figure. The control computer controls component mounting operation based on design information including the corresponding relationship of the type of panel being produced and the type of component to be mounted, image data of board camera 47 and component camera 5, detection information of sensors which are not shown in the figure, and so on.

Next, the configuration of head holding section 44, single nozzle head 45, and two types of multiple nozzle heads 46 and 47 of component transfer device 4 are described along with the holding method of each head 45 to 47 by head holding section 44. In the first embodiment, with multiple nozzle heads 46 and 47, which are also referred to as rotary heads, multiple suction nozzles are selected in order by being revolved such that pickup of components and mounting them onto a board is performed in order. Note that, multiple nozzle heads are not limited to rotary heads, and may be heads with multiple suction nozzles arranged in a line, or heads with multiple suction nozzles arranged in a grid.

Figure 2:
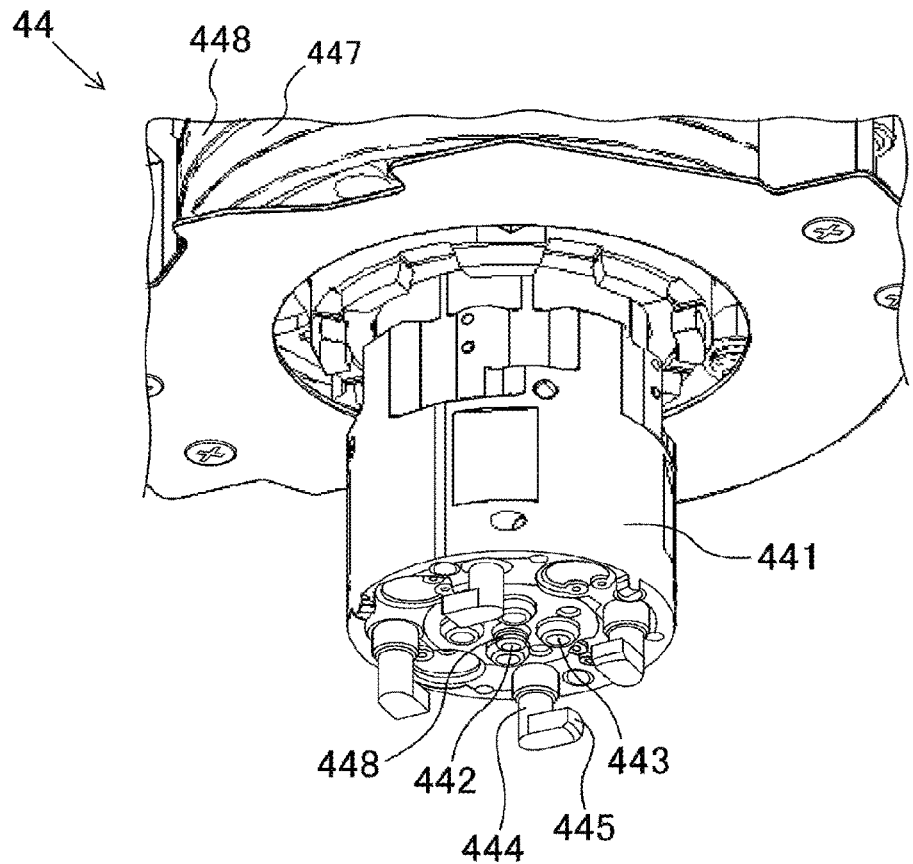
FIG. 2 is a perspective view showing a head holding section obliquely from below.

FIG. 2 is a perspective view showing head holding section 44 obliquely from below. As shown in the figure, head holding section 44 has cylindrical R axis 441 extending downwards. Central supply passage 442 opens in the center of the lower side of R axis 441. Four circumferential supply passages 443 are arranged at a 90 degree pitch on a circumference surrounding central supply passage 442. Central supply passage 442 and circumferential supply passages 443 protrude slightly downwards and O-ring 446 for sealing is engaged on the outside of the protruding portion.

Four rod-shaped engaging members 444 are protruding downwards at a 90 degree pitch on a wider circumference than circumferential supply passages 443. The upper end of engaging members 444 extend inside R axis 441, while the lower end of engaging members 44 has locking section 445. Locking section 445 is bent horizontally in the circumference direction and forms an L-shape or J-shape when seen from the side. Engaging member 444 is movable vertically with respect to R axis 441 and is moved up/down by an air cylinder which is not shown in the figure. θ-axis driving gear 447 is provided on an upper part of R axis 441, and R-axis driving gear 448 is provided above θ-axis driving gear 447. R-axis driving gear 448 is joined to R axis 441. Thus, a head 45 to 47 held on R axis 441 rotates along with R axis 441 when R-axis driving gear 448 is rotated by an R-axis motor which is not shown in the figure.

Figure 3:
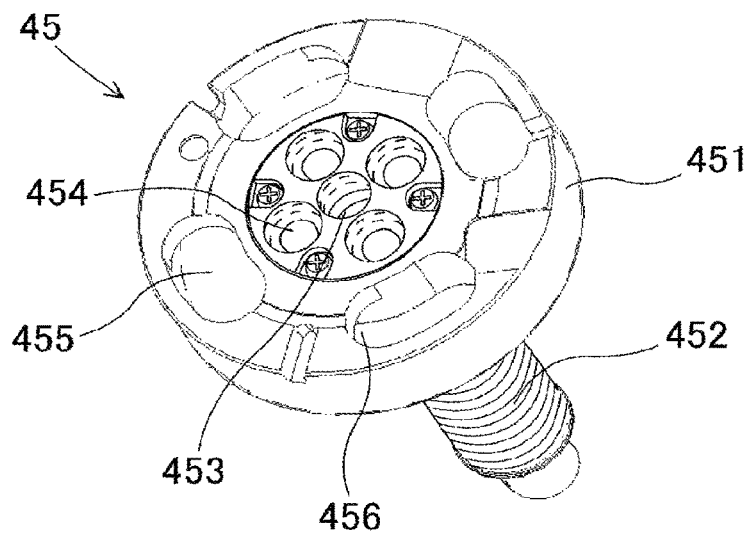
FIG. 3 is a perspective view showing a single nozzle head obliquely from above.

FIG. 3 is a perspective view showing single nozzle head 45 obliquely from above. Single nozzle head 45 exchangeably holds one suction nozzle. As shown in FIG. 3, single nozzle head 45 is configured from disc-shaped flange 451, nozzle holder 452 that extends downwards from the center of flange 451, and so on. A suction nozzle which is not shown in the figure is exchangeably held on the lower side of nozzle holder 452 so as to be vertically movable. Central supply passage 453 opens on the upper center of flange 451. Central supply passage 453 connects to a suction nozzle held on nozzle holder 452. Four hollow-shaped circumferential closure sections 454 are formed at a 90 degree pitch on a circumference around central supply passage 453. Four engaging elongated holes 455 are formed at a 90 degree pitch on a wider circumference than circumferential closure sections 454. Engaging elongated holes 455 extend while bending along the circumference direction, and locked section 456 is inserted inside the hole in the circumference direction. Single nozzle head 45 is arranged in a head exchange station (not shown) on base 9 of component mounter 1.

The method by which head holding section 44 holds single nozzle head 45 is described below. First, the head driving section moves head holding section 44 directly above single nozzle 45 in the head exchange station (not shown). Next, the air cylinder of head holding section drives engaging member 444 downwards such that locking section 445 at the lower end of engaging member 44 engages with engaging elongated hole 455 of single nozzle head 45. Third, in head holding section 44, by the R-axis motor rotating R axis 441 via R-axis driving gear 448, locking section 445 of engaging member 444 enters locked section 456 of engaging elongated hole 455 from the side. Fourth, by the air cylinder driving engaging member 444 upwards, with locked section 456 locked into locking section 445. The entire single nozzle head 45 is raised. By this, head holding section 44 holds single nozzle head 45 in a state contacting the lower side of R axis 441.

With head holding section 44 holding single nozzle head 45, central supply passage 442 of 44 and central supply passage 453 of 45 are connected to each other. Also, the four circumferential supply passages 443 of head holding section 44 are closed by the four circumferential closure sections 454 of single nozzle head 45. Also, the suction nozzle on the lower end of single nozzle head 45 also rotates by the rotation of R axis 441.

Figure 4:
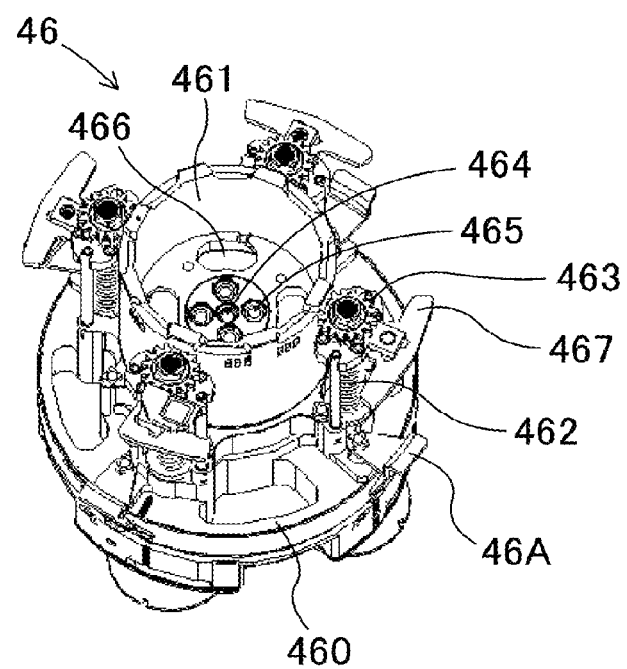
FIG. 4 is a perspective view showing a four-nozzle multiple nozzle head obliquely from above.

FIG. 4 is a perspective view showing four-nozzle multiple nozzle head 46 obliquely from above. Four-nozzle multiple nozzle head 46 exchangeably holds four suction nozzles. As shown in FIG. 4, four-nozzle multiple nozzle head 46 is configured from head main body 460, cylinder gear 461, four sets of nozzle holders 462, and so on. Cylinder gear 461 has gear teeth (not shown) extending in an axial direction around the circumferential surface of the cylinder, and is provided on bearings on an upper side of head main body 460 so as to be relatively rotatable around the same axis. Four sets of nozzle holders 462 are provided at a 90 degree pitch around head main body 460 so as to be vertically moveable. At the lower end of each nozzle holder 462, a suction nozzle which is not shown is held exchangeably. Engaging portion 467 and θ-axis gear 463 are provided on the upper side of each nozzle holder 462. Engaging portion 467 is raised/lowered by a Z-axis drive mechanism which is not shown, and the suction nozzle is raised/lowered by this. θ-axis gear 463 is slidably engaged in a vertical direction with gear teeth on the outer surface of cylinder gear 461 on the inside.

Central supply passage 464 opens in the center of the upper surface of head main body 460. Four circumferential supply passages 465 are provided at a 90 degree pitch on a circumference around central supply passage 464. Four engaging elongated holes 466 are formed at a 90 degree pitch on a wider circumference than circumferential supply passages 465. Engaging elongated holes 466 are the same shape as engaging elongated holes 455 of single nozzle head 45 and have a locked section.

A switching valve which is not shown is provided for each nozzle holder 462 inside four-nozzle multiple nozzle head 46. A valve operating portion 46A is provided towards the lower end of each nozzle holder 462 to operate the switching valve. The four sets of nozzle holder 462 are moved by the rotation of R axis 441 selectively to a predetermined rotation position that corresponds to a pickup position or a mounting position. Nozzle holder 462 positioned at the pickup position or the mounting position is capable of being raised/lowered by engaging portion 467 engaging with a Z-axis driving mechanism which is not shown, and valve operating portion 46A is capable of being switched by engaging with a valve switching mechanism which is not shown. By this, the switching valve of nozzle holder 462 is able to selectively connect the held suction nozzle to central supply passage 464 or circumferential supply passage 465. Four-nozzle multiple nozzle head 46 is also arranged in the head exchange station (not shown).

Figure 5:
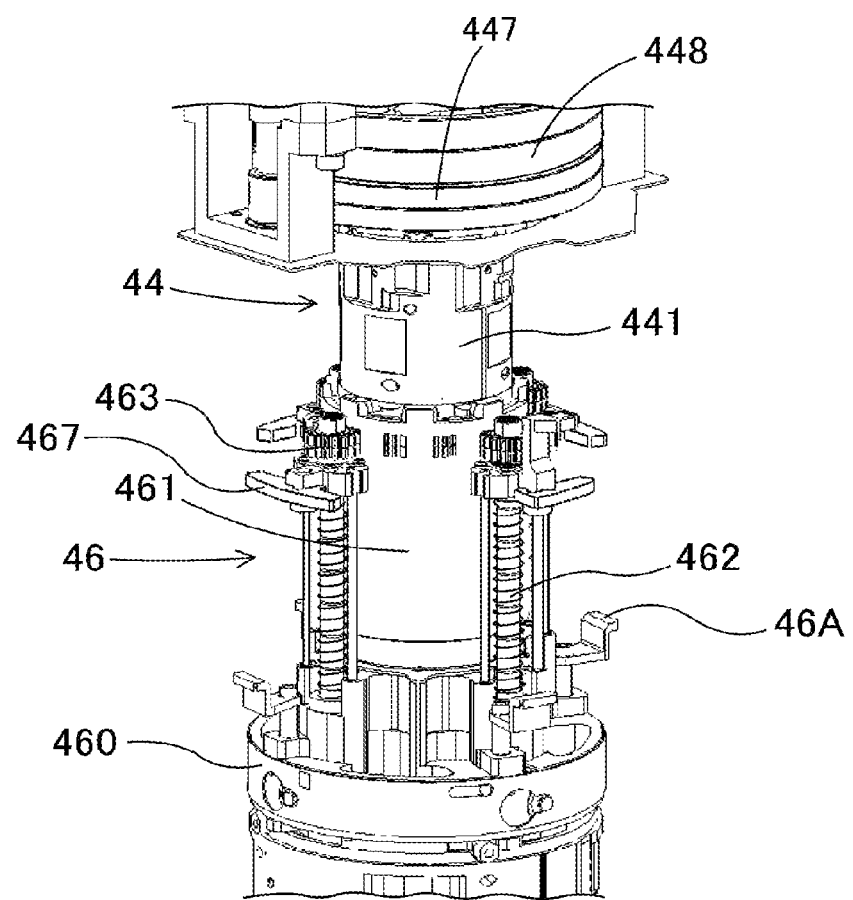
FIG. 5 is a perspective view showing from the side a four-nozzle multiple nozzle head in a state held by the head holding section.

The method by which head holding section 44 holds four-nozzle multiple nozzle head 46 is similar to that by which head holding section 44 holds single nozzle head 45. FIG. 5 is a perspective view showing from the side four-nozzle multiple nozzle head 46 in a state just before being held by head holding section 44. From the state in FIG. 5, R axis 441 of head holding section 44 is lowered so as to enter cylinder gear 461 of four-nozzle multiple nozzle head 46. Then, engaging members 444 of head holding section 44 engage with engaging elongated holes 466 of four-nozzle multiple nozzle head 46 such that head holding section 44 holds four-nozzle multiple nozzle head 46 in a state contacting the lower side of R axis 441.

At this time, central supply passage 442 of 44 and central supply passage 464 of 46 are connected to each other. Also, the four circumferential supply passages 443 of head holding section 44 and the four circumferential supply passages 465 of four-nozzle multiple nozzle head 46 are connected to each other respectively. Further, θ-axis driving gear 447 of head holding section 44 and cylinder gear 461 of four-nozzle multiple nozzle head 46 are engaged with each other. By this, if θ-axis driving gear 447 is rotated by a θ-axis motor which is not shown, the suction nozzle is rotated via cylinder gear 461 and θ-axis gear 463.

Figure 6:
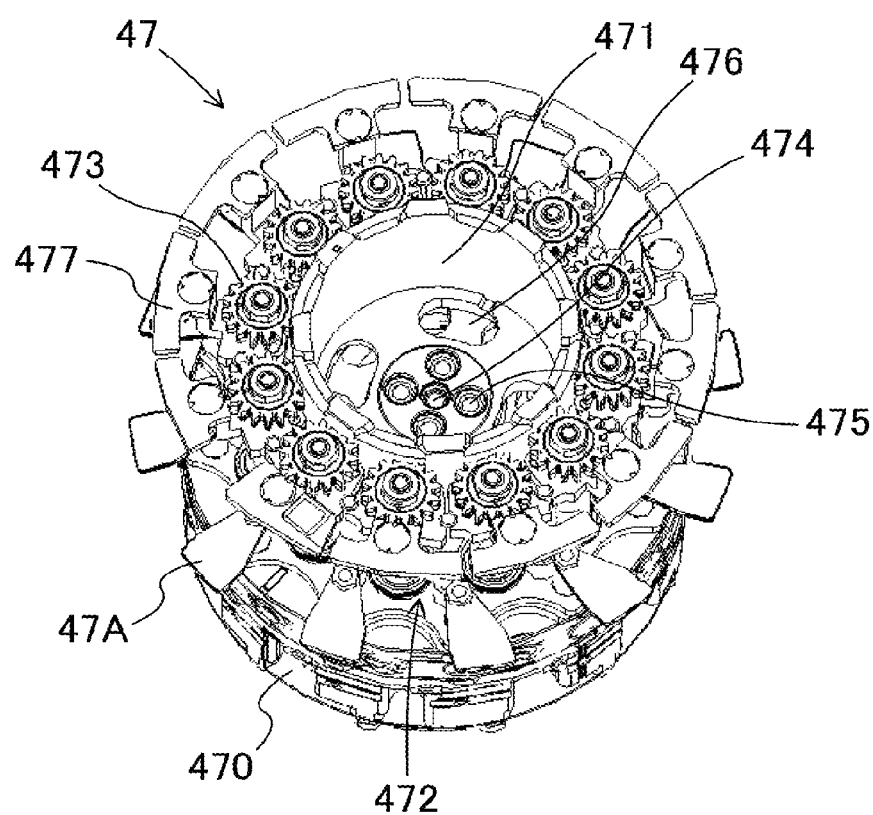
FIG. 6 is a perspective view showing a twelve-nozzle multiple nozzle head obliquely from above.

FIG. 6 is a perspective view showing twelve-nozzle multiple nozzle head 47 obliquely from above. Twelve-nozzle multiple nozzle head 47 exchangeably holds twelve suction nozzles. As shown in FIG. 6, twelve-nozzle multiple nozzle head 47 is configured from head main body 470, cylinder gear 471, twelve sets of nozzle holders 472, and so on. Cylinder gear 471 has gear teeth (not shown) extending in an axial direction around the circumferential surface of the cylinder, and is provided on bearings on an upper side of head main body 470 so as to be relatively rotatable around the same axis. Twelve sets of nozzle holders 472 are provided at a 30 degree pitch around head main body 470 so as to be vertically moveable. At the lower end of each nozzle holder 472, a suction nozzle which is not shown is held exchangeably. Engaging portion 477 and θ-axis gear 473 are provided on the upper side of each nozzle holder 472. Engaging portion 477 is raised/lowered by a Z-axis drive mechanism which is not shown, thus raising/lowering the suction nozzle. θ-axis gear 473 is slidably engaged in a vertical direction with gear teeth of cylinder gear 471 on the inside.

Central supply passage 474 opens on a central inside portion on the bottom surface of cylinder gear 471. Four circumferential supply passages 475 are provided at a 90 degree pitch on a circumference around central supply passage 474. Four engaging elongated holes 476 are formed at a 90 degree pitch on a wider circumference than circumferential supply passages 475. The shape of central supply passages 474, circumferential supply passages 475, and engaging elongated holes 476 respectively match central supply passages 464, circumferential supply passages 465, and engaging elongated holes 466 of four-nozzle multiple nozzle head 46.

A switching valve 478 (refer to FIG. 10) is provided for each nozzle holder 472 inside twelve-nozzle multiple nozzle head 47. A valve operating portion 47A is provided towards the lower end of each nozzle holder 472 to operate switching valve 478. The twelve sets of nozzle holder 472 are moved by the rotation of R axis 441 selectively to a predetermined rotation position that corresponds to a pickup position or a mounting position. Nozzle holder 472 positioned at the pickup position or the mounting position is capable of being raised/lowered by engaging portion 477 engaging with a Z-axis driving mechanism which is not shown, and valve operating portion 47A is capable of being switched by engaging with a valve switching mechanism which is not shown. By this, switching valve 478 of nozzle holder 462 is able to selectively connect the held suction nozzle 479 (refer to FIG. 10) to central supply passage 474 or circumferential supply passage 475. Twelve-nozzle multiple nozzle head 47 is also arranged in the head exchange station (not shown).

Figure 7:
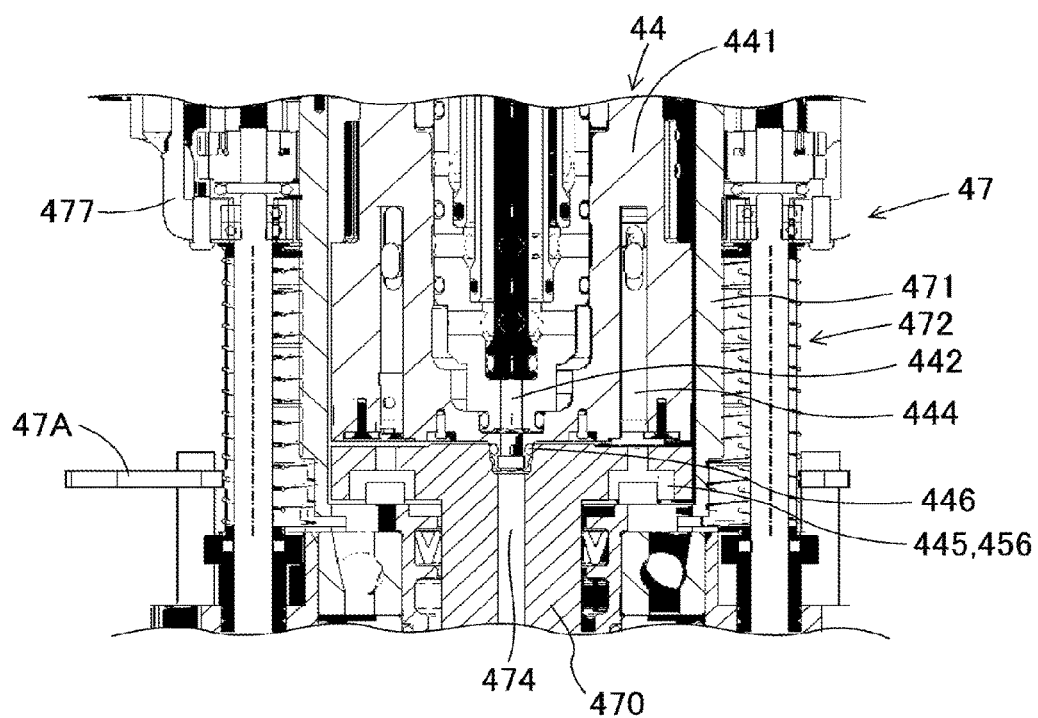
FIG. 7 is a side view cross-section showing a twelve-nozzle multiple nozzle head in a state held by the head holding section.

The method by which head holding section 44 holds twelve-nozzle multiple nozzle head 47 is the same as that by which head holding section 44 holds four-nozzle multiple nozzle head 46. FIG. 7 is a side view cross-section showing twelve-nozzle multiple nozzle head 47 in a state held by head holding section 44. As shown in the figure, R axis 441 of head holding section 44 is inserted into cylinder gear 471 of twelve-nozzle multiple nozzle head 47. Then, head holding section 44 holds twelve-nozzle multiple nozzle head 47 in a state contacting the lower side of R axis 441.

At this time, central supply passage 442 of head holding section 44 and central supply passage 474 of twelve-nozzle multiple nozzle head 47 are connected to each other. Also, the four circumferential supply passages 443 of head holding section 44 and the four circumferential supply passages 475 of twelve-nozzle multiple nozzle head 47 are connected to each other respectively. As shown in FIG. 7, O-ring 446 provided on the outside of central supply passage 442 of head holding section 44 presses against the internal surface of central supply passage 474 of twelve-nozzle multiple nozzle head 47, thus maintaining an airtight state. Maintaining of an airtight state by an O-ring is achieved in the same manner by the connection respectively of circumferential supply passages 443 and 475 which are not shown in the figure. Further, maintaining of an airtight seal by an O-ring is achieved in the same manner with single nozzle head 45 and four-nozzle multiple nozzle head 46.

Further, θ-axis driving gear 447 of head holding section 44 and cylinder gear 471 of twelve-nozzle multiple nozzle head 47 are engaged with each other. By this, if θ-axis driving gear 447 is rotated by a θ-axis motor which is not shown, the suction nozzle is rotated via cylinder gear 471 and θ-axis gear 473.

Figure 8:
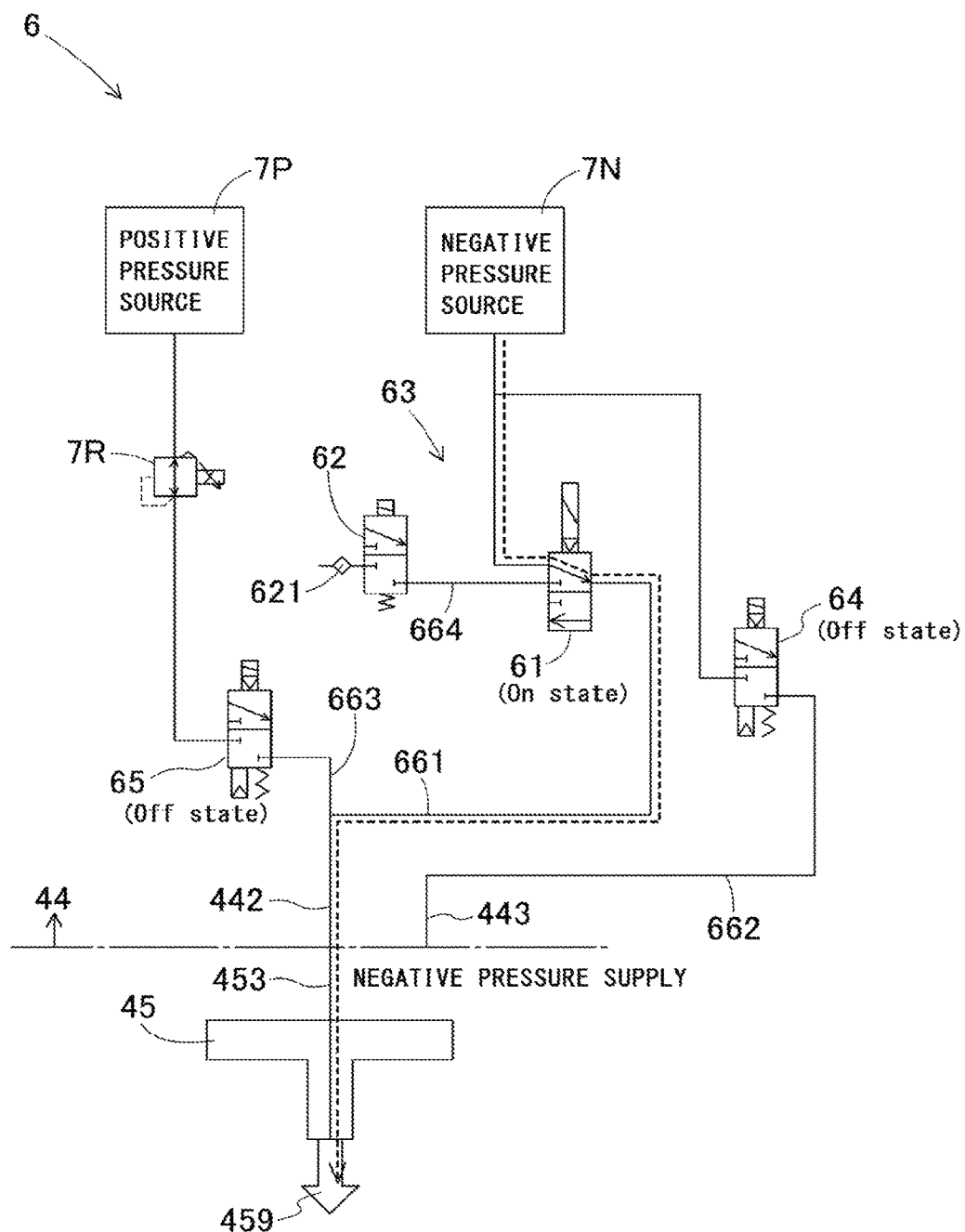
FIG. 8 is an air supply/discharge system diagram of a pickup/mounting driving section that also illustrates pickup operation of a suction nozzle of a single nozzle head.

Next, the configuration of pickup/mounting driving section 6 included in component transfer device 4 is described. FIG. 8 is an air supply/discharge system diagram of pickup/mounting driving section 6. Pickup/mounting driving section 6 is provided on head holding section 44 and is configured from single-use valve mechanism 63 including negative pressure valve 61 and atmosphere valve 62, multiple-use negative pressure valve 64, positive pressure valve 65, multiple supply passages that supply and discharge air, and the like. Pickup/mounting driving section 6 uses negative pressure source 7N and positive pressure source 7P to drive the pickup operation and mounting operation of suction nozzles 459 and 479 of each head 45 to 47.

There are no particular restrictions on the configuration of negative pressure source 7N or positive pressure source 7P, nor are there any particular restrictions on the size of the negative pressure or positive pressure supplied. In the first embodiment, negative pressure source 7N is an air pump built in to head holding section 44 that supplies negative pressure close to a vacuum. Also, positive pressure source 7P is compressed air supply equipment provided for common use in the factory in which component mounter 1 is installed. The positive pressure supplied by the compressed air supply equipment is, for example, 0.5 MPa, which is excessive as positive pressure used to release a component from a suction nozzle during component mounting using component mounter 1. Therefore, regulator 7R is provided inside component mounter 1. Regulator 7R lowers the positive pressure of positive pressure source 7P to supply an appropriate fixed supply of positive pressure. The supply amount of positive pressure air is limited for regulator 7R, and if an excessively large amount of positive pressure air is supplied, a fixed level of positive pressure cannot be maintained.

Single-use negative pressure supply passage 661 that connects central supply passage 442 to negative pressure source 7N, and positive pressure supply passage 663 that connects central supply passage 442 to regulator 7R are provided inside head holding section 44. Further, multiple-use negative pressure supply passage 662 that connects circumferential supply passage 443 to negative pressure source 7N is provided inside head holding section 44 as well.

Negative pressure valve 61 is provided at a point along the route of single-use negative pressure supply passage 661. A conventional electromagnetic switching valve may be used for negative pressure valve 61. As shown in FIG. 8, negative pressure valve 61 connects central supply passage 442 to negative pressure source 7N when on. Also, negative pressure valve 61 connects central supply passage 442 to an end of atmosphere supply passage 664 when off (refer to FIG. 9).

Atmosphere valve 62 is provided on the other end of atmosphere supply passage 664. A conventional electromagnetic open/close valve may be used for atmosphere valve 62. As shown in FIG. 8, atmosphere valve 62 blocks atmosphere supply passage 664 when off. Also, atmosphere value 62 connects atmosphere supply passage 664 to the atmosphere via air filter 621 when on.

Multiple-use negative pressure valve 64 is provided at a point along the route of multiple-use negative pressure supply passage 662. A conventional electromagnetic open/close valve may be used for multiple-use negative pressure valve 64. As shown in FIG. 8, multiple-use negative pressure valve 64 blocks multiple-use negative pressure supply passage 662 when off. Also, multiple-use negative pressure valve 64 connects circumferential supply passage 443 to negative pressure source 7N when on (refer to FIG. 10).

Positive pressure valve 65 is provided at a point along the route of positive pressure supply passage 663. A conventional electromagnetic open/close valve may be used for positive pressure valve 65. As shown in FIG. 8, positive pressure valve 65 blocks positive pressure supply passage 663 when off. Also, positive pressure valve 65 connects central supply passage 442 to regulator 7R when on (refer to FIG. 9).

Negative pressure valve 61, atmosphere valve 62, multiple-use negative pressure valve 64, and positive pressure valve 65 that configure pickup/mounting driving section 6 are controlled independently from the control computer to switch between an on state and an off state.

Next, pickup operation and mounting operation of suction nozzle 459 of single nozzle head 45 held on head holding section 44 will be described. As shown in FIG. 8, when head holding section 44 holds single nozzle head 45, central supply passage 442 of head holding section 44 is connected to suction nozzle 459 via central supply passage 453 of single nozzle head 45. Also, circumferential supply passages 443 of head holding section 44 are closed. FIG. 8 also illustrates pickup operation of suction nozzle 459 of single nozzle head 45. Multiple-use negative pressure supply passage 662 is not used for single nozzle head 45, and multiple-use negative pressure valve 64 is always maintained in an off state (blocked state).

As shown in FIG. 8, to pick up a component by lowering the internal pressure of suction nozzle 459, the control computer controls positive pressure valve 65 to be off, and controls negative pressure valve 61 to be on. By this, suction nozzle 459 is cut off from regulator 7R and connected to negative pressure source 7N such that negative pressure is supplied (refer to the kinked dashed line in FIG. 8), by which the internal pressure is lowered to perform pickup operation. Note that, in this case, atmosphere valve 62 may be on or off.

Figure 9:
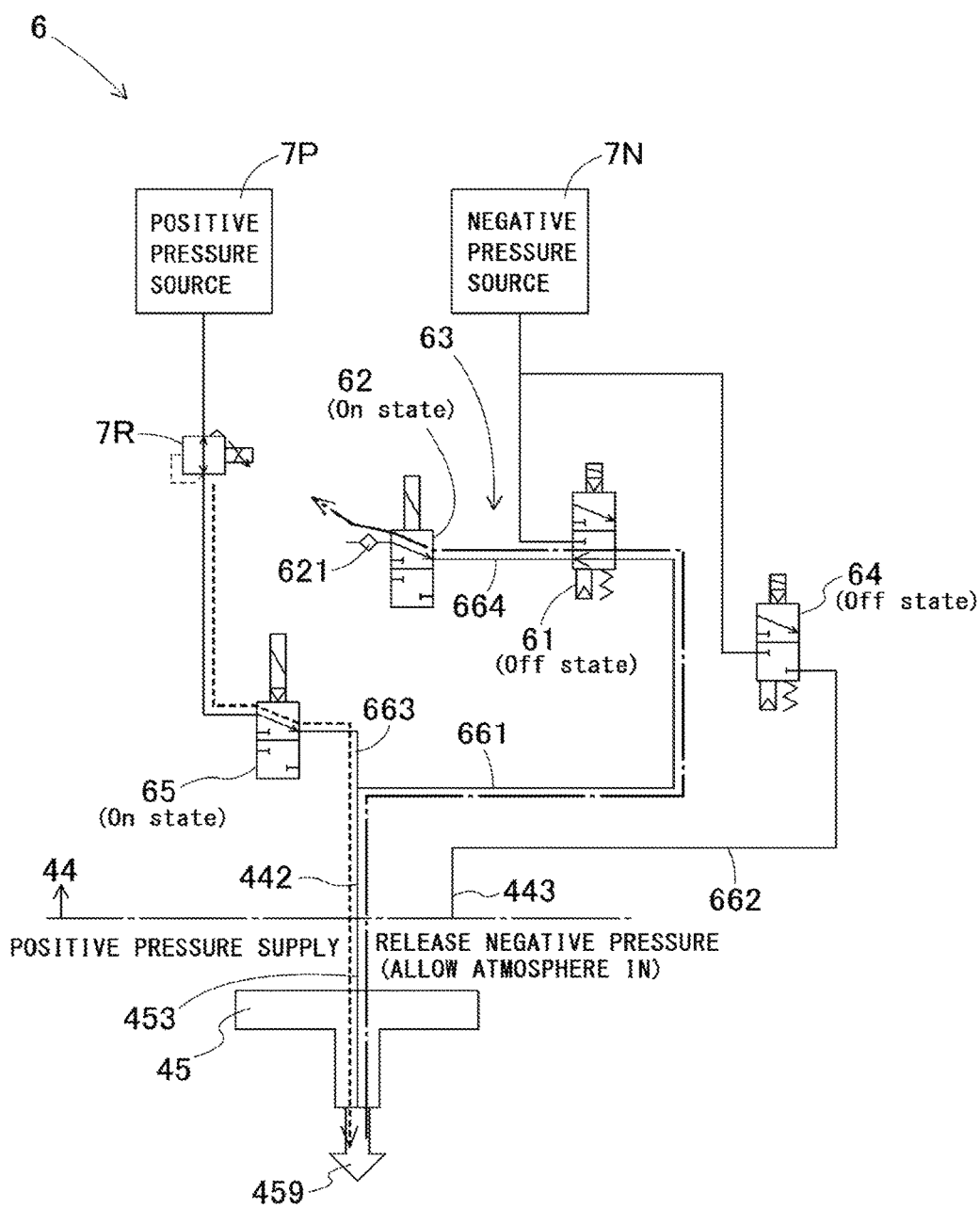
FIG. 9 illustrates mounting operation of a suction nozzle of a single nozzle head.

Also, FIG. 9 illustrates mounting operation of suction nozzle 459 of single nozzle head 45. To mount the component on the board by raising the internal pressure of suction nozzle 459, the control computer controls negative pressure valve 61 to be off and controls atmosphere valve 62 and positive pressure valve 65 to be on. By this, suction nozzle 459 is connected to the atmosphere and to regulator 7R. Thus, because outside air enters such that the negative pressure rises (refer to the alternate long and short dash kinked line in FIG. 9), the internal pressure of suction nozzle 459 rises rapidly up to a given point. Then, the internal pressure of suction nozzle 459 is raised by the positive pressure supply from regulator 7R (refer to the kinked dashed line in FIG. 9). That is, by introducing outside air from the atmosphere, operation to raise the pressure by positive pressure supply from regulator 7R is assisted up to a given point.

Figure 10:
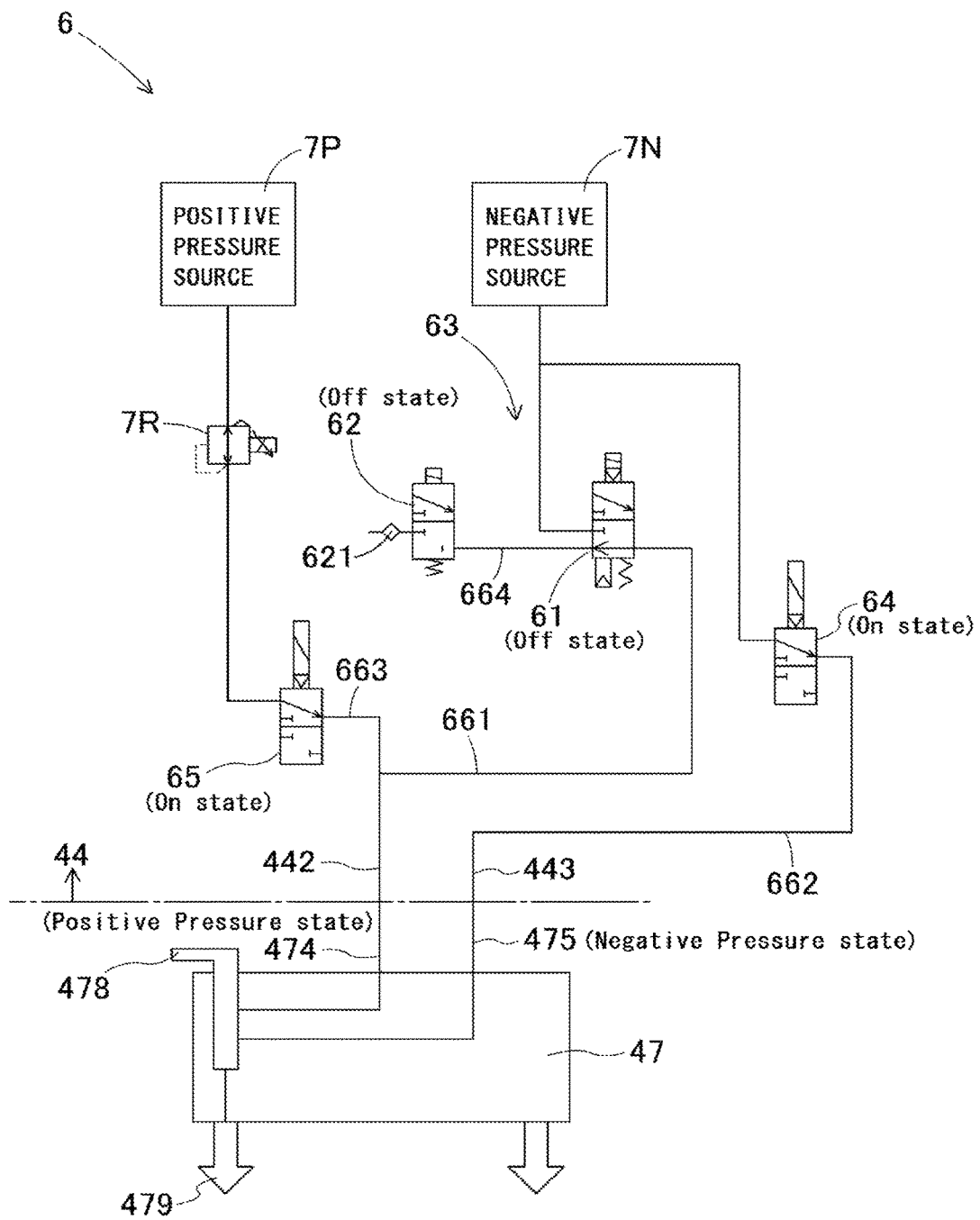
FIG. 10 illustrates pickup operation and mounting operation of a selected suction nozzle of a twelve-nozzle multiple nozzle head.

Described next is pickup operation and mounting operation of the selected suction nozzle 479 that is positioned at the pickup position or mounting position of four-nozzle multiple nozzle head 46 or twelve-nozzle multiple nozzle head 47 held by head holding section 44. The operation of four-nozzle multiple nozzle head 46 and twelve-nozzle multiple nozzle head 47 is similar so descriptions are given using twelve-nozzle multiple nozzle head 47 as an example. FIG. 10 illustrates pickup operation and mounting operation of selected suction nozzle 459 of twelve-nozzle multiple nozzle head 47. As shown in the figure, when head holding section 44 holds twelve-nozzle multiple nozzle head 47, central supply passage 442 of head holding section 44 is connected to switching valve 478 via central supply passage 474 of twelve-nozzle multiple nozzle head 47. Also, the four circumferential supply passages 443 of head holding section 44 are connected to switching valve 478 via circumferential supply passages 475 of twelve-nozzle multiple nozzle head 47. Switching valve 478 is operated by raising/lowering control of valve operating portion 47A performed from the control computer; when valve operating portion 47A is raised, the selected suction nozzle 479 is connected to central supply passage 474; when valve operating portion is lowered, the selected suction nozzle 479 is connected to circumferential supply passage 475.

Here, single-use valve mechanism 63 is not used for four-nozzle multiple nozzle head 46 and twelve-nozzle multiple nozzle head 47. That is, as shown in FIG. 10, negative pressure valve 61 and atmosphere valve 62 is always maintained in an off state. By this, single-use negative pressure supply passage 661 is closed. Thus, the positive pressure air of positive pressure supply passage 663 goes to a point along the route of single-use negative pressure supply passage 661 connected via central supply passage 442, but does not escape to the atmosphere.

Further, with respect to four-nozzle multiple nozzle head 46 and twelve-nozzle multiple nozzle head 47, the control computer controls multiple-use negative pressure valve 64 and positive pressure valve 65 to always be on. By this, the pressure is raised inside central supply passage 474 of twelve-nozzle multiple nozzle head 47 in advance to bring central supply passage 474 to a positive pressure state, and the pressure is lowered inside circumferential supply passages 475 in advance to bring circumferential supply passages 475 to a negative pressure state.

In this state, the control computer selectively supplies negative pressure or positive pressure to suction nozzle 479 by performing switching operation of switching valve 478. Thus, suction nozzle 479 is able to perform pickup of a component and mounting of the component onto a board. When the pickup or mounting of the component by suction nozzle 479 is complete, the control computer rotates twelve-nozzle multiple nozzle head 47 30 degrees and then proceeds to control of the adjacent switching valve 478 and suction nozzle 479. Thereafter, by repeating the above up to twelve times, it is possible to perform pickup operation or mounting operation consecutively for twelve suction nozzles 479.

Figure 11:
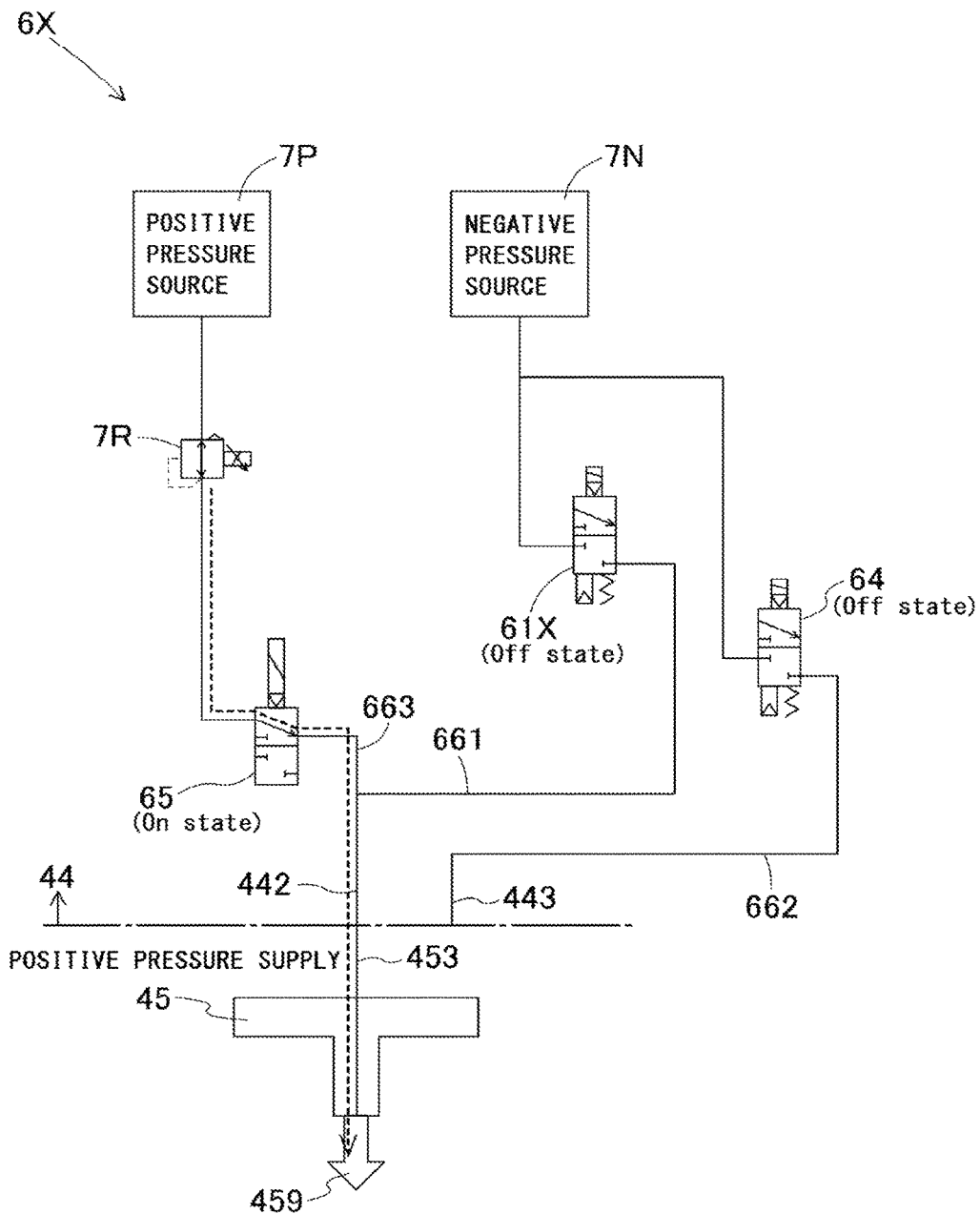
FIG. 11 is an air supply/discharge system diagram of a conventional pickup/mounting driving section that also illustrates pickup operation of a suction nozzle of a single nozzle head.

Described below is the effect of component transfer device 4 of component mounter 1 of the first embodiment given above in comparison to conventional technology. FIG. 11 is an air supply/discharge system diagram of a conventional pickup/mounting driving section 6X that also illustrates pickup operation of suction nozzle 459 of single nozzle head 45. With conventional pickup/mounting driving section 6X, instead of single-use valve mechanism 63, negative pressure valve 61X comprised of a conventional electromagnetic open/close valve is provided on negative pressure supply passage 661. Negative pressure valve 61X connects central supply passage 442 to negative pressure source 7N in an on state, and blocks negative pressure supply passage 661 in an off state.

With conventional pickup/mounting driving section 6X, pickup operation of suction nozzle 459 of single nozzle head 45 held by head holding section 44 is the same as the first embodiment, while mounting operation is different to the first embodiment. As shown in FIG. 11, to mount the component on the board by raising the internal pressure of suction nozzle 459, with conventional technology, negative pressure valve 61X is controlled to be off, and positive pressure valve 65 is controlled to be on. By this, suction nozzle 459 is cut off from a supply of negative pressure, and positive pressure is supplied by being connected to regulator 7R. However, unlike the first embodiment, outside air is not introduced.

Figure 12:
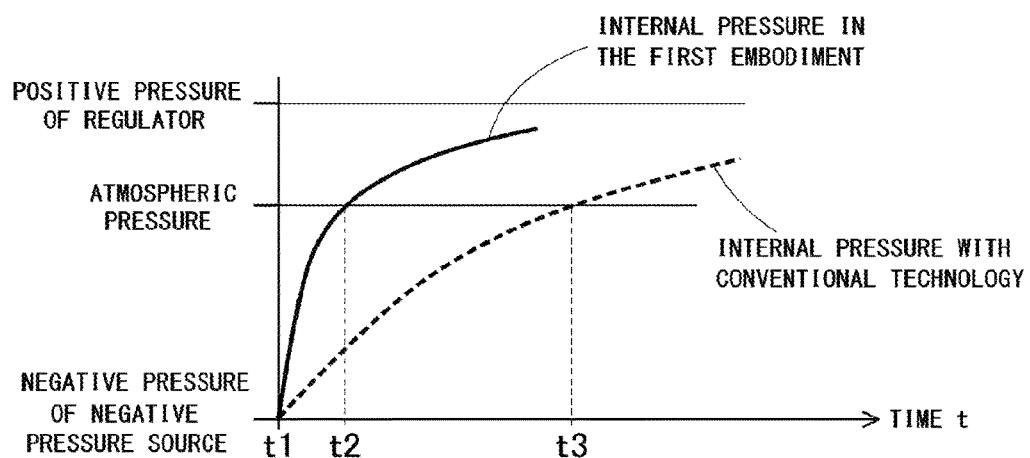
FIG. 12 is a graph showing the change over time of the internal pressure when a suction nozzle of a single nozzle head performs mounting operation for the first embodiment and for conventional technology.

FIG. 12 is a graph showing the change over time of the internal pressure when suction nozzle 459 of single nozzle head 45 performs mounting operation for the first embodiment and for conventional technology. In FIG. 12, time t is shown on the horizontal axis, and the internal pressure of suction nozzle 459 is shown on the vertical axis; the solid line in the graph representing the first embodiment, and the dashed line represents conventional technology.

With conventional technology, when operation to release the component from suction nozzle 459 (mounting operation) is started at time t1, negative pressure valve 61X turns off and positive pressure valve 65 turns on. The internal pressure of suction nozzle 459 raises in accordance with the positive pressure supplied from regulator 7R. However, the range in which positive pressure is required is not only suction nozzle 459, but also includes central supply passage 454 of single nozzle head 45, central supply passage 442 of head holding section 44, and a portion of negative pressure supply passage 661, which is a large volume. Therefore, with the supplied amount of positive air pressure being the limited supply of regulator 7R, the internal pressure rises slowly. Thus, the responsiveness of pressure rising is worse, the time t3 at which the internal pressure of suction nozzle 459 reaches substantially atmospheric pressure and the component is released and mounted on the board is slow, and the time required for mounting is long ($=t3-t1$).

In contrast, with the first embodiment, when operation to release the component from suction nozzle 459 (mounting operation) is started at time t1, negative pressure valve 61 turns off and atmospheric valve 62 and positive pressure valve 65 turn on. The internal pressure of suction nozzle 459 rises in accordance with both the positive pressure supplied from regulator 7R and the atmospheric pressure of the outside air which is introduced. Here, because the amount of outside air introduced is exceptionally large compared to the limited amount of positive pressure air supplied from regulator 7R, the responsiveness of pressure rising up to close to atmospheric pressure is good even when the required volume for the range of pressure rising is large. Thus, the time t2 at which the internal pressure of suction nozzle 459 reaches substantially atmospheric pressure and the component is released and mounted on the board is much faster, and the time required for mounting is greatly reduced ($=t2-t1$).

Also, with the first embodiment, in cases in which the rising rate of the internal pressure is excessive, causing a worry about the mounting operation becoming unstable, atmospheric valve 62 may be returned to an off state while the internal pressure of suction nozzle 459 is rising. By this, introduction of outside air is stopped, and the rising rate when the internal pressure reaches atmospheric pressure is restrained such that mounting operation can be stabilized.

Note that, with the first embodiment and conventional technology, operation is no different between four-nozzle multiple nozzle head 46 and twelve-nozzle multiple nozzle head 47. When mounting operation is performed for selected suction nozzle 479 of four-nozzle multiple nozzle head 46 or twelve-nozzle multiple nozzle head 47, as described using FIG. 10, central supply passage 474 of twelve-nozzle multiple nozzle head 47 is raised to a given level in advance. Thus, the required range of pressure rising during mounting operation is limited to the extremely small volume range from switching valve 478 to suction nozzle 479. Thus, positive pressure is maintained and the responsiveness of rising pressure is good, even when pressure is raised for all twelve suction nozzles 479, just by the limited amount of positive pressure supplied from regulator 7R, and without introducing outside air.

The component transfer device 4 of component mounter 1 of the first embodiment comprises: single nozzle head 45 that has one suction nozzle 459 which picks up a component from a supply position by making the internal pressure of the suction nozzle negative and mounts the component on a circuit held at a fixed position by raising the internal pressure of the suction nozzle; multiple nozzle heads 46 and 47 that have multiple suction nozzles 479; head holding section 44 that exchangeably holds single nozzle head 45 and multiple nozzle heads 46 and 47; pickup/mounting driving section 6 provided on head holding section 44 that connects with suction nozzle 459 of the held single nozzle head 45 and a selected suction nozzle 479 of the held multiple nozzle head 46 or 47, and raises/lowers the internal pressure of the suction nozzle; and a head driving section (Y-axis rails 41 and 42, Y-axis slider 43, and the like) that drives head holding section 44 and the held single nozzle head 45 or the held multiple nozzle head 46 or 47 between a supply position and board K held at a fixed position; wherein pickup/mounting driving device 6, when making suction nozzle 459 of the held single nozzle head 45 perform mounting of the component, cuts off suction nozzle 459 from negative pressure source 7N, connects suction nozzle 459 to positive pressure source 7P, and connects suction nozzle 459 to the atmosphere.

According to this, when making suction nozzle 459 of single nozzle head 45 held by head holding section 44 mount a component, pickup/mounting driving section 6 cuts off suction nozzle 459 from negative pressure source 7N, connects suction nozzle 459 to positive pressure source 7P, and connects suction nozzle 459 to the atmosphere. By connecting suction nozzle 459 to the atmosphere, outside air is introduced such that the negative pressure rises, with the internal pressure of the suction nozzle rising rapidly for a while, and then rising in accordance with the positive pressure from positive pressure source 7P. In other words, introducing outside air assists for a while the pressure rising effect from positive pressure source 7P. This makes the responsiveness good when the internal pressure of suction nozzle 459 is being raised, which reduces the time required for mounting.

Also, with the first embodiment, pickup/mounting driving section 6 has: single-use valve mechanism 63 provided on single-use negative pressure supply passage 661 that connects suction nozzle 459 of held single nozzle head 45 to negative pressure source 7N, that is able to connect or cut off suction nozzle 459 of single nozzle head 45 to/from negative pressure source 7N and the atmosphere; multiple-use negative pressure valve 64 provided on multiple-use negative pressure supply passage 662 that connects selected suction nozzle 479 of held multiple nozzle head 47 to negative pressure source 7N, that is able to connect or cut off the selected suction nozzle 479 to/from negative pressure source 7N; and positive pressure valve 65 provided on positive pressure supply passage 663 that connects suction nozzle 459 of held single nozzle head 45 and selected suction nozzle 479 of held multiple nozzle head 47 to positive pressure source 7P; wherein the multiple nozzle head 47 has switching valve 478 that is capable of connecting selected suction nozzle 479 to multiple-use negative pressure supply passage 662 and positive pressure supply passage 663.

Further, when head holding section 44 is holding single nozzle head 45, single-use valve mechanism 63 connects suction nozzle 459 of single nozzle head 45 to the atmosphere, and positive pressure valve 65 connects suction nozzle 459 of single nozzle head 45 to positive pressure source 7P, such that the internal pressure of suction nozzle 459 of single nozzle head 45 is raised.

Thus, according to the first embodiment, when head holding section 44 is holding single nozzle head 45, single-use valve mechanism 63 can switch suction nozzle 459 of single nozzle head 45 between three states: connected to negative pressure source 7N, connected to the atmosphere, or blocked. Other the other hand, positive pressure valve 65 can switch can switch suction nozzle 459 of single nozzle head 45 between two states: connected to positive pressure source 7P, or blocked. Thus, to pick up a component with suction nozzle 459, positive pressure valve 65 is blocked, and suction nozzle 459 is connected to negative pressure source 7N by single-use valve mechanism 63, such that the internal pressure of suction nozzle 459 becomes negative. Also, to mount the component held by suction nozzle 459 onto a board, suction nozzle 459 is connected to the atmosphere or blocked by single-use valve mechanism 63, and suction nozzle 459 is connected to positive pressure source 7P by positive pressure valve 65, such that the internal pressure of suction nozzle 459 is raised. At this time, because switching of single-use valve mechanism 63 can be controlled according to characteristics of positive pressure source 7P, the responsiveness is good when the internal pressure of suction nozzle 459 is being raised, which reduces the time required for mounting. Also, because adjustment can be performed such that the rate at which the internal pressure of suction nozzle 459 rises is not excessively large, mounting operation is stable.

Further, with the first embodiment, when head holding section 44 is holding single nozzle head 45, single-use valve mechanism 63 connects suction nozzle 459 of single nozzle head 45 to the atmosphere, and positive pressure valve 65 connects suction nozzle 459 of single nozzle head 45 to positive pressure source 7P, such that the internal pressure of suction nozzle 459 of single nozzle head 45 is raised.

According to this, when head holding section 44 is holding single nozzle head 45, because outside air is introduced by connecting suction nozzle 459 to the atmosphere such that the negative pressure rises, the internal pressure of the suction nozzle rises rapidly for a while, and then rises in accordance with the positive pressure from positive pressure source 7P. In other words, introducing outside air assists for a while the pressure rising effect from positive pressure source 7P. This makes the responsiveness good when the internal pressure of suction nozzle 459 is being raised, which reduces the time required for mounting.

Further, with the first embodiment, when head holding section 44 is holding twelve-nozzle multiple nozzle head 47, mechanical valve 478 connects selected suction nozzle 479 to positive pressure supply passage 663, positive pressure valve 65 connects selected suction nozzle 479 to positive pressure source 7P, such that the internal pressure of selected suction nozzle 479 is raised.

According to this, when head holding section 44 is holding twelve-nozzle multiple nozzle head 47, mechanical valve 478 connects selected suction nozzle 479 to positive pressure supply passage 663, and positive pressure valve 65 connects selected suction nozzle 479 to positive pressure source 7P, such that the internal pressure of selected suction nozzle 479 is raised. At this time, single-use valve mechanism 63 and multiple-use negative pressure valve 64 do not perform supply or exhaust of air, thus the amount to raise the pressure is limited, a given positive pressure can be maintained in multiple suction nozzles 479, and mounting operation is stable.

Further, with the first embodiment, single-use valve mechanism 63 includes: negative pressure valve 61 provided on single-use negative pressure supply passage 661 that is capable of selectively connecting suction nozzle 479 of single nozzle head 45 to negative pressure source 7N or an end of atmosphere supply passage 664; and atmosphere valve 62 provided on the other end of atmosphere supply passage 664 that connects atmosphere supply passage 664 to the atmosphere.

According to this, because single-use valve mechanism 63 can be realized by using a simple electromagnetic switching valve for negative pressure valve 61 and a simple electromagnetic open/close valve for atmosphere valve 62, cost increases can be curtailed.

Further, in the first embodiment, positive pressure source 7P includes regulator 7R that maintains positive pressure at a fixed level.

According to this, even with a configuration in which the amount of positive pressure air supplied from regulator 7R is limited, responsiveness when raising the internal pressure can be good for both single nozzle head 45 and multiple nozzle heads 46 and 47, and mounting operation can be stabilized. In other words, with single nozzle head 45, because pressure raising operation can be assisted a portion of the way by introducing outside air to suction nozzle 459, the pressure can be raised reliably even if the amount of positive pressure air supplied is limited. Also, with multiple nozzle heads 46 and 47, because the volume to raise the pressure is limited, the pressure can be raised reliably even if the amount of positive pressure air supplied is limited.

Below, with respect to a component transfer device of a component mounter of a second embodiment and a third embodiment which feature single-use valve mechanism 63 of the first embodiment with a changed internal configuration, the differences compared to the first embodiment are mainly described.

Figure 13:
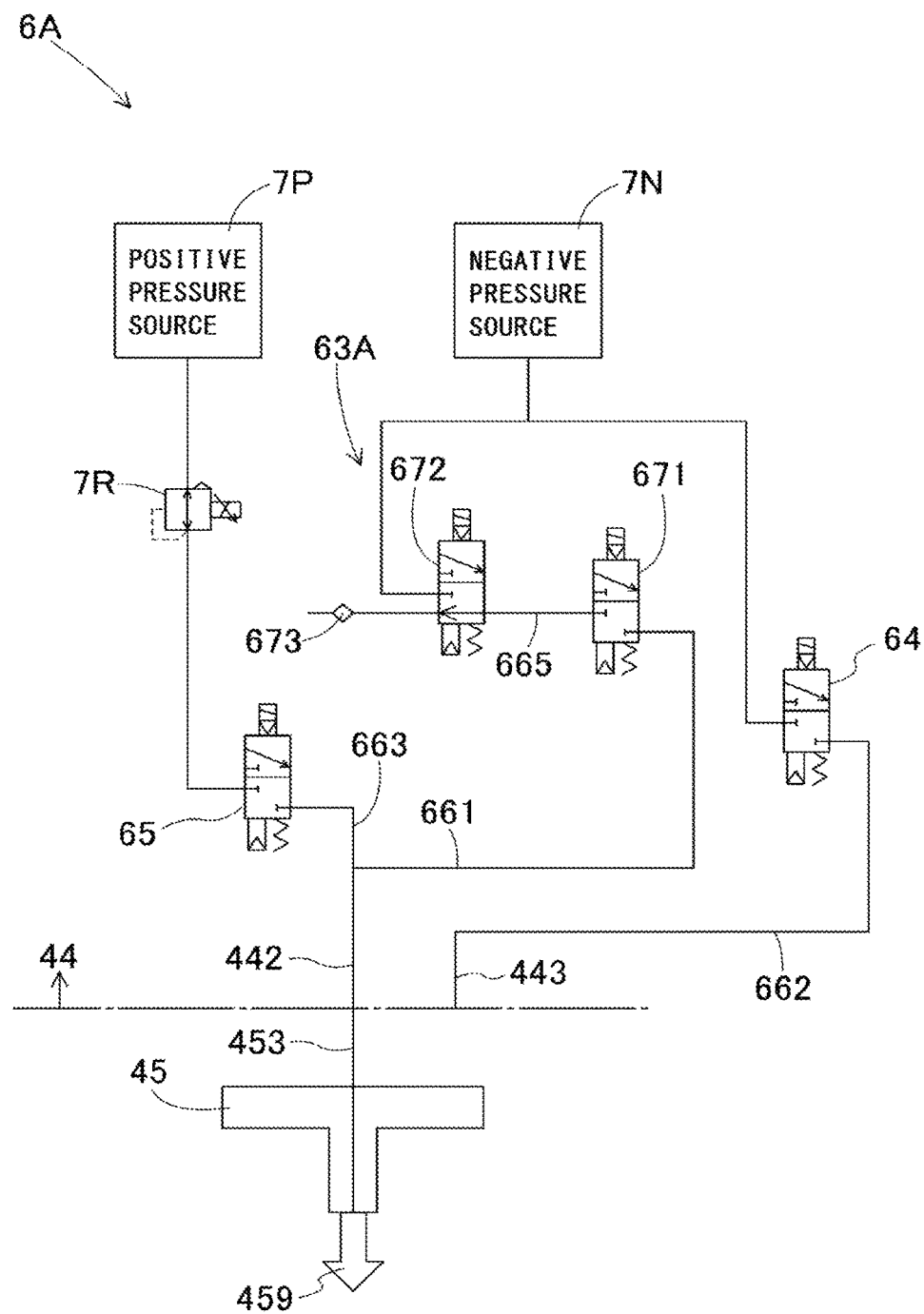
FIG. 13 is an air supply/discharge system diagram of the pickup/mounting driving section of the component transfer device of a second embodiment.

FIG. 13 is an air supply/discharge system diagram of pickup/mounting driving section 6A of the component transfer device of a second embodiment. With pickup/mounting driving section 6A of the second embodiment, only single-use valve mechanism 63A is different from the first embodiment. In the second embodiment, single-use valve mechanism 63A includes first electromagnetic open/close valve 671 and first electromagnetic switching valve 672. First electromagnetic open/close valve 671 is provided on negative pressure supply passage 661, connects central supply passage 442 to an end of common supply passage 665 when on, and blocks negative pressure supply passage 661 when off. First electromagnetic switching valve 672 is provided on the other end of common supply passage 665, connects common supply passage 665 to negative pressure source 7N when on, and connects common supply passage 665 to the atmosphere via air filter 673 when off.

Figure 14:
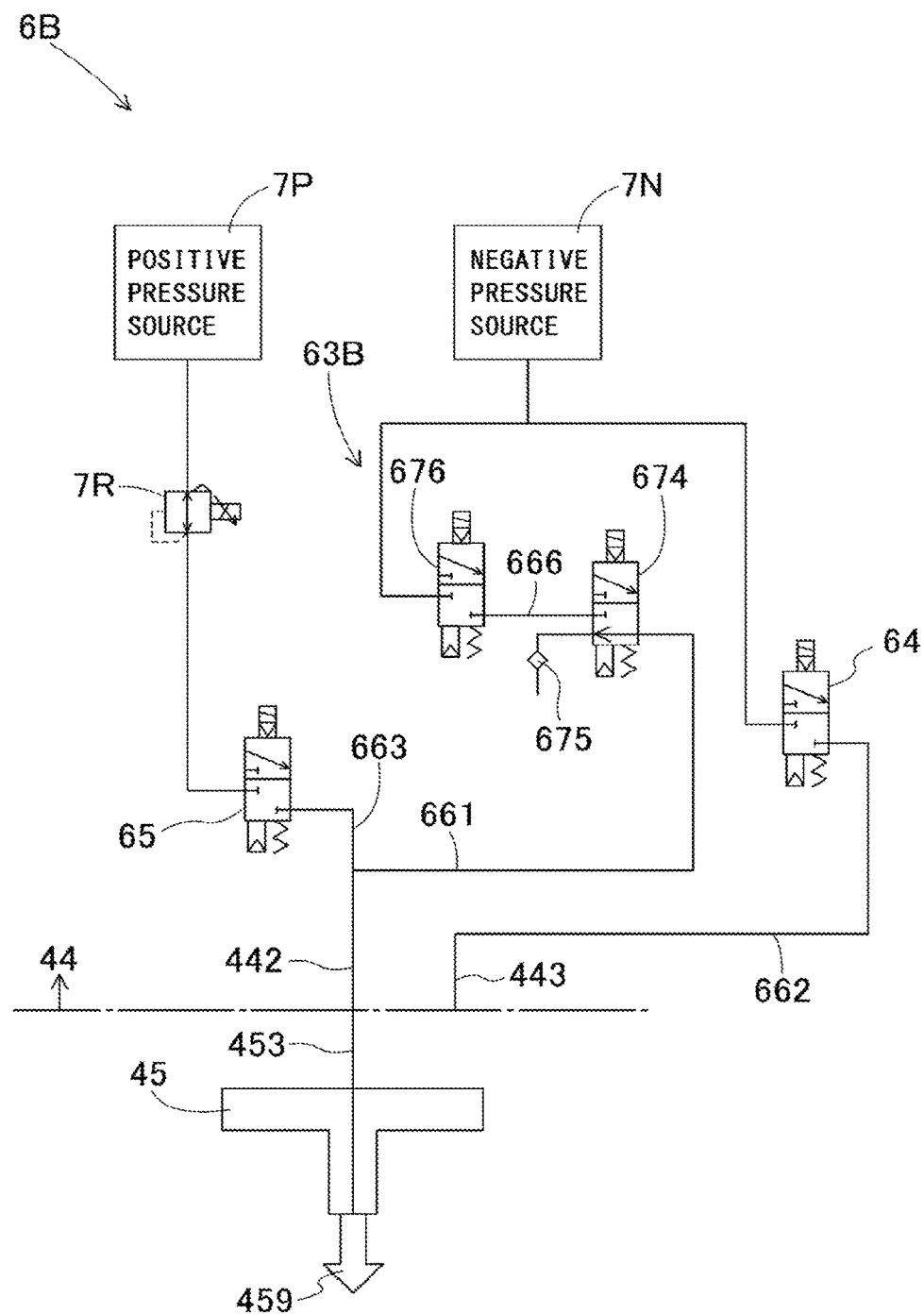
FIG. 14 is an air supply/discharge system diagram of the pickup/mounting driving section of the component transfer device of a third embodiment.

FIG. 14 is an air supply/discharge system diagram of pickup/mounting driving section 6B of the component transfer device of a third embodiment. With pickup/mounting driving section 6B of the third embodiment, only single-use valve mechanism 63B is different from the first embodiment. In the third embodiment, single-use valve mechanism 63B includes second electromagnetic switching valve 674 and second electromagnetic open/close valve 676. Second electromagnetic switching valve 674 is provided on negative pressure supply passage 661, connects central supply passage 442 to common supply passage 666 when on, and connects central supply passage 442 to the atmosphere via air filter 675 when off. Second electromagnetic open/close valve 676 is provided on the other end of common supply passage 666, connects common supply passage 666 to negative pressure source 7N when on, and blocks common supply passage 666 when off.

Single-use valve mechanism 63A of the second embodiment, and single-use valve mechanism 63B of the third embodiment have the same switching and opening/closing functionality as single-use valve mechanism 63 of the first embodiment. Thus, the effects of the second and third embodiments are the same as those of the first embodiment.

Note that, with the first to third embodiments, when performing mounting operation of suction nozzle 459 of single nozzle head 45, outside air may be introduced first, and then positive pressure supply started after a delay. Also, as given above, introduction of outside air may be stopped at any point. Further, as single-use valve mechanism 63, 63A, and 63B, a mechanism may be used that uses an electromagnetic valve which switchably controls three intake ports with respect to one reference exhaust port.

Figure 15:
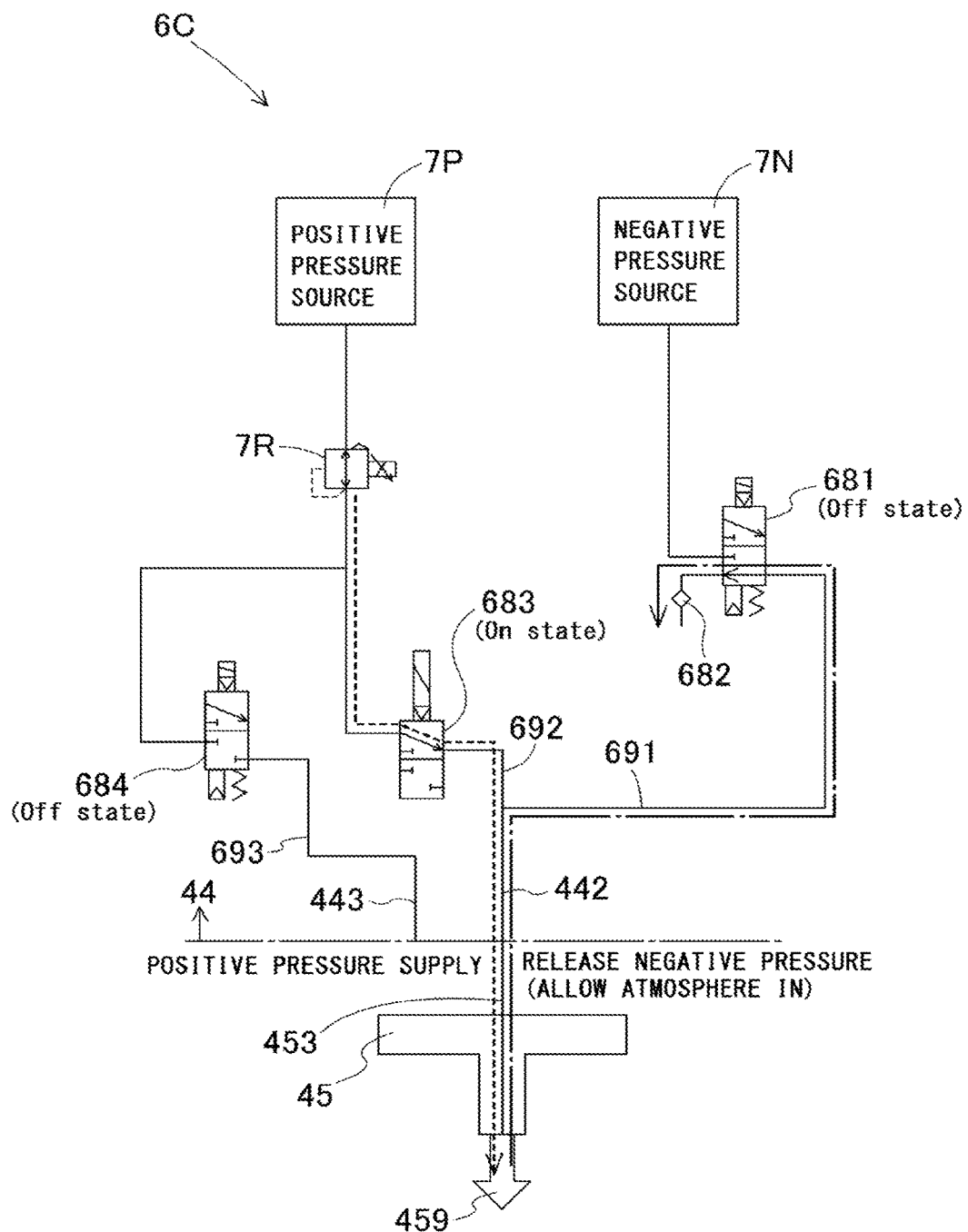
FIG. 15 is an air supply/discharge system diagram of the pickup/mounting driving section of the component transfer device of a fourth embodiment that also illustrates mounting operation of a suction nozzle of a single nozzle head.

Next, with respect to a component transfer device of a component mounter of a fourth embodiment, the differences compared to the first three embodiments are mainly described. FIG. 15 is an air supply/discharge system diagram of pickup/mounting driving section 6C of the component transfer device of a fourth embodiment that also illustrates mounting operation of suction nozzle 459 of single nozzle head 45. With the fourth embodiment, unlike the first three embodiments, negative supply passage 691 is common, and the positive supply passage is split into single-use positive pressure supply passage 692 and multiple-use positive pressure supply passage 693.

With the fourth embodiment shown in FIG. 15, negative pressure supply passage 691 that connects central supply passage 442 to negative pressure source 7N, and single-use positive pressure supply passage 692 that connects central supply passage 442 to regulator 7R are provided inside head holding section 44. Further, multiple-use positive pressure supply passage 693 that connects circumferential supply passages 443 to regulator 7R is provided inside head holding section 44.

Negative pressure valve 681 is provided at a point along the route of negative pressure supply passage 691. A conventional electromagnetic switching valve may be used for negative pressure valve 681. Negative pressure valve 681 connects central supply passage 442 to negative pressure source 7N when on (refer to FIG. 16), and connects central supply passage 442 to the atmosphere via air filter 682 when off (refer to FIG. 15). Single-use positive pressure valve 683 is provided at a point along the route of single-use negative pressure supply passage 692. A conventional electromagnetic open/close valve may be used for single-use positive pressure valve 683. Single-use positive pressure valve 683 connects central supply passage 442 to regulator 7R when on (refer to FIG. 15). When off, single-use positive pressure valve 683 blocks single-use negative pressure supply passage 692. Multiple-use positive pressure valve 684 is provided at a point along the route of multiple-use positive pressure supply passage 693. A conventional electromagnetic open/close valve may be used for multiple-use positive pressure valve 684. Multiple-use positive pressure valve 684 connects circumferential supply passages 443 to regulator 7R when on (refer to FIG. 16), and blocks multiple-use positive pressure supply passage 693 when off. Negative pressure valve 681, atmosphere valve 62, single-use positive pressure valve 683, and multiple-use positive pressure valve 684 that configure pickup/mounting driving section 6C are controlled independently from the control computer to switch between an on state and an off state.

Next, mounting operation of suction nozzle 459 of single nozzle head 45 held on head holding section 44 will be described. Multiple-use positive pressure supply passage 693 is not used for single nozzle head 45, and is always maintained in an off state (blocked state). To release a component by raising the pressure inside suction nozzle 459 from a state of negative pressure, as shown in FIG. 15, the control computer controls negative pressure valve 681 to be off and controls single-use positive pressure valve 683 to be on. By this, suction nozzle 459 is blocked from negative pressure source 7N, connected to the atmosphere, and connected to regulator 7R. Thus, because outside air enters such that the negative pressure rises (refer to the alternate long and short dash kinked line in FIG. 15), the internal pressure of suction nozzle 459 rises rapidly up to a given point. Then, the internal pressure of suction nozzle 459 is raised by the positive pressure supply from regulator 7R (refer to the kinked dashed line in FIG. 15). That is, by introducing outside air from the atmosphere, operation to raise the pressure by positive pressure supply from regulator 7R is assisted up to a given point.

Figure 16:
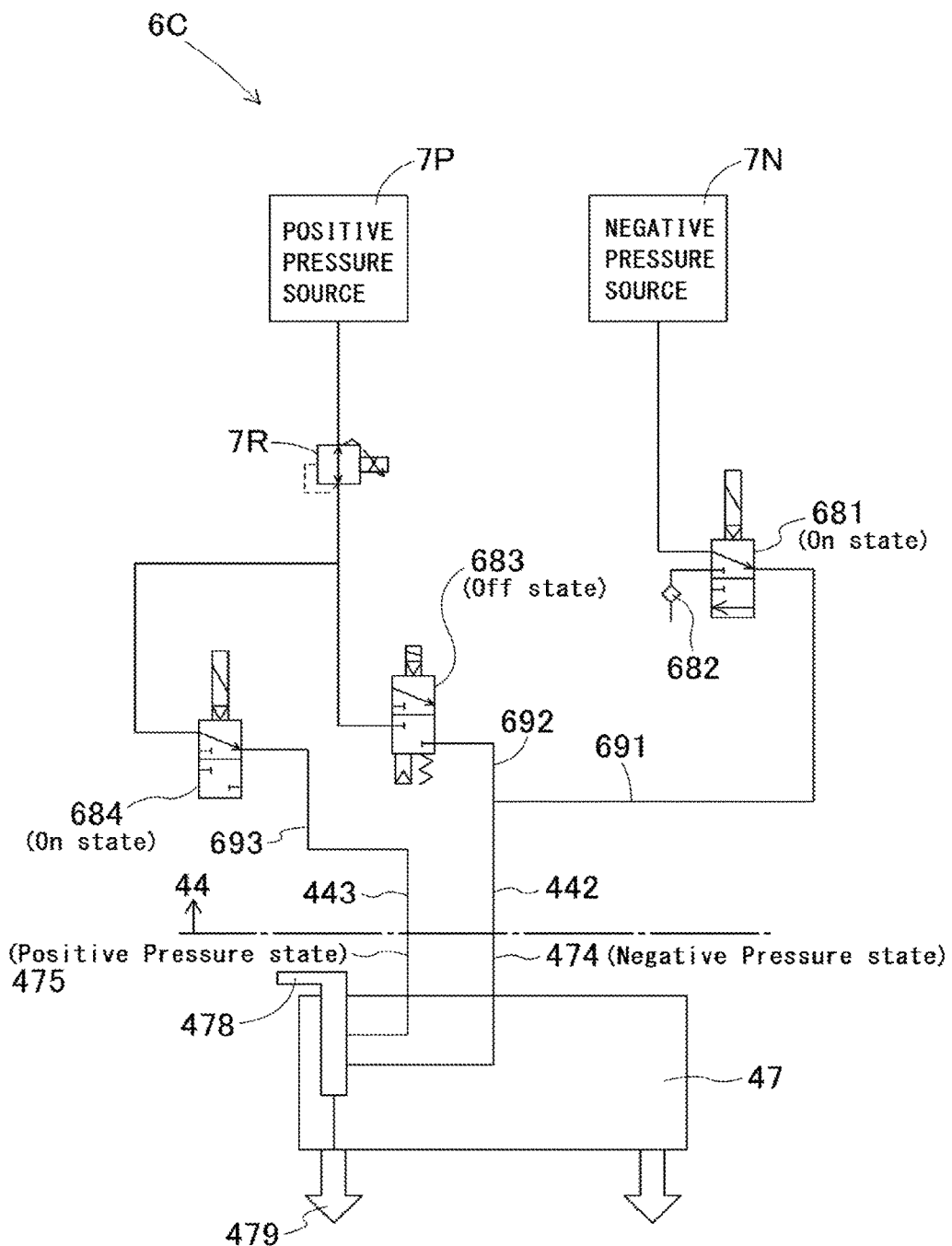
FIG. 16 illustrates pickup operation and mounting operation of a selected suction nozzle of a twelve-nozzle multiple nozzle head for the fourth embodiment.

Described next is pickup operation and mounting operation of the selected suction nozzle 479 that is positioned at the pickup position or mounting position of twelve-nozzle multiple nozzle head 47 held by head holding section 44. FIG. 16 illustrates pickup operation and mounting operation of a selected suction nozzle 479 of twelve-nozzle multiple nozzle head 47 for the fourth embodiment. Single-use positive pressure supply valve 683 is not used for twelve-nozzle multiple nozzle head 47, and is always maintained in an off state (blocked state). For twelve-nozzle multiple nozzle head 47, the control computer controls negative pressure valve 681 and multiple-use positive pressure valve 684 to always be on. By this, the pressure is lowered inside central supply passage 474 of twelve-nozzle multiple nozzle head 47 in advance to bring central supply passage 474 to a negative pressure state, and the pressure is raised inside circumferential supply passages 475 in advance to bring circumferential supply passages 475 to a positive pressure state.

In this state, the control computer selectively supplies negative pressure or positive pressure to suction nozzle 479 by performing switching operation of switching valve 478. However, compared to the first three embodiments, note that the positive pressure and negative pressure states of central supply passage 474 and circumferential supply passage 475 are reversed. By this, suction nozzle 479 is able to perform pickup of a component and mounting of the component onto a board.

According to the component transfer device of the fourth embodiment, to mount the component held by suction nozzle 459 of single nozzle head 45 onto a board, suction nozzle 459 is cut off from negative pressure source 7N and connected to the atmosphere by negative pressure valve 681, and suction nozzle 459 is connected to positive pressure source 7P by single-use positive pressure valve 683, such that the internal pressure of suction nozzle 459 is raised. At this time, by connecting suction nozzle 459 to the atmosphere, outside air is introduced such that the negative pressure rises, with the internal pressure of the suction nozzle rising rapidly for a while, and then rising in accordance with the positive pressure from positive pressure source 7P. In other words, introducing outside air assists for a while the pressure rising effect from positive pressure source 7P. This makes the responsiveness good when the internal pressure of suction nozzle 459 is being raised, which reduces the time required for mounting. Compared to the first three embodiments, the quantity of valves is reduced, thus greatly curtailing cost increases.

| Reference Signs List | | |
|---|---|---|
| 1: component mounter | | |
| 2: board conveyance device | 3: component supply device | 4: component transfer device |
| 44: head holding section | 442: central supply passage | 443: circumferential supply section |
| 453: central supply passage | 454: circumferential closure section | 459: suction nozzle |
| 46: four-nozzle multiple nozzle head | | |
| 464: central supply passage | 465: circumferential supply passage | |
| 47: twelve-nozzle multiple nozzle head | 474: central supply passage | |
| 475: circumferential supply passage | 478: switching valve | 479: suction nozzle |
| 5: component camera | | |
| 6, 6A, 6B, 6C: pickup/mounting driving section | | |
| 6X: conventional pickup/mounting driving section | | |
| 61, 61X: negative pressure valve | 62: atmosphere valve | |
| 63, 63A, 63B: single-use valve mechanism | | |
| 64: multiple-use negative pressure valve | 65: positive pressure valve | |
| 671: first electromagnetic open/close valve | 672: first electromagnetic switching valve | |

| Reference Signs List |
| --- |
| 674: second electromagnetic switching valve     676: second electromagnetic open/close valve |
| 681: negative pressure valve |
| 683: single-use positive pressure valve     684: multiple-use positive pressure valve |
| 7N: negative pressure source     7P: positive pressure source     7R: regulator |

The invention claimed is:

1. A component transfer device of a component mounter comprising:
   a single nozzle head that has one suction nozzle which picks up a component from a supply position by making an internal pressure of the suction nozzle negative and mounts the component on a board held at a fixed position by raising the internal pressure of the suction nozzle;
   a multiple nozzle head that has multiple suction nozzles;
   a head holding section that exchangeably holds the single nozzle head and the multiple nozzle head, the head holding section including a supply passage that is connected to the suction nozzle of the single nozzle head and supplies a negative pressure or a positive pressure to the suction nozzle of the single nozzle head, a negative pressure supply passage being connected to the supply passage, and a positive pressure supply passage being connected to the supply passage;
   a pickup/mounting driving section provided on the head holding section that connects with the suction nozzle of the held single nozzle head and a selected suction nozzle of the held multiple nozzle head, and raises/lowers the internal pressure of the suction nozzle; and
   a head driving section that drives the head holding section and the held single nozzle head or the held multiple nozzle head between the supply position and the board held at a fixed position;
   wherein the pickup/mounting driving device, when making the suction nozzle of the held single nozzle head perform mounting of the component, connects the positive pressure supply passage to a positive pressure source, cuts off the negative pressure supply passage from a negative pressure source, and connects the negative pressure supply passage to the atmosphere.

2. The component transfer device of the component mounter according to claim 1,
   wherein the positive pressure source includes a regulator that maintains positive pressure at a fixed level.

3. A component transfer device of a component mounter comprising:
   a single nozzle head that has one suction nozzle which picks up a component from a supply position by making an internal pressure of the negative and mounts the component on a board held at a fixed position by raising the internal pressure of the suction nozzle;
   a multiple nozzle head that has multiple suction nozzles;
   a head holding section that exchangeably holds the single nozzle head and the multiple nozzle head;
   a pickup/mounting driving section provided on the head holding section that connects with the suction nozzle of the held single nozzle head and a selected suction nozzle of the held multiple nozzle head, and raises/lowers the internal pressure of the suction nozzle; and
   a head driving section that drives the head holding section and the held single nozzle head or the held multiple nozzle head between the supply position and the board held at a fixed position,
   wherein the pickup/mounting driving device, when making the suction nozzle of the held single nozzle head perform mounting of the component, cuts off the suction nozzle from a negative pressure source, connects the suction nozzle to a positive pressure source, and connects the suction nozzle to the atmosphere,
   wherein the pickup/mounting driving device includes
      a single-use valve mechanism, provided on a single-use negative pressure supply passage that connects the suction nozzle of the held single nozzle head to the negative pressure sources, that connects the suction nozzle of the single nozzle head to the negative pressure source, connects the suction nozzle of the single nozzle head to the atmosphere, or cuts off the suction nozzle of the single nozzle head from the negative pressure source and the atmosphere,
      a multiple-use negative pressure valve, provided on a multiple-use negative pressure supply passage that connects the selected suction nozzle of the held multiple nozzle head to the negative pressure source, that connects the selected suction nozzle to the negative pressure source or cuts off the selected suction nozzle from the negative pressure source, and
      a positive pressure valve, provided on a positive pressure supply passage that connects the suction nozzle of the held single nozzle head and the selected suction nozzle of the held multiple nozzle head to the positive pressure source, that connects the suction nozzle to the positive pressure source or cuts off the suction nozzle from the positive pressure source, and
   wherein the multiple nozzle head includes a switching valve that connects the selected suction nozzle to the multiple-use negative pressure supply passage or the positive pressure supply passage.

4. The component transfer device of the component mounter according to claim 3,
   wherein, when the head holding section is holding the single nozzle head, the single-use valve mechanism connects the suction nozzle of the single nozzle head to the atmosphere, and the positive pressure valve connects the suction nozzle of the single nozzle head to the positive pressure source, such that the internal pressure of the suction nozzle of the single nozzle head is raised.

5. The component transfer device of the component mounter according to claim 3,
   wherein, when the head holding section is holding the multiple nozzle head, the switching valve connects the selected suction nozzle to the positive pressure supply passage, and the positive pressure valve connects the selected suction nozzle to the positive pressure source, such that the internal pressure of the selected suction nozzle is raised.

6. The component transfer device of the component mounter according to claim 3,
   wherein the single-use valve mechanism includes
      a negative pressure valve, provided on the single-use negative pressure supply passage, that selectively connects the suction nozzle of the single nozzle head to the negative pressure source or an end of the atmosphere supply passage, and
      an atmosphere valve, provided on the other end of the atmosphere supply passage, that connects the atmosphere supply passage to the atmosphere or cuts off the atmosphere supply passage from the atmosphere.

7. A component transfer device of a component mounter comprising:
   a single nozzle head that has one suction nozzle which picks up a component from a supply position by making an internal pressure of the suction nozzle negative and mounts the component on a board held at a fixed position by raising the internal pressure of the suction nozzle;
   a multiple nozzle head that has multiple suction nozzles;
   a head holding section that exchangeably holds the single nozzle head and the multiple nozzle head;
   a pickup/mounting driving section provided on the head holding section that connects with the suction nozzle of the held single nozzle head and a selected suction nozzle of the held multiple nozzle head, and raises/lowers the internal pressure of the suction nozzle; and
   a head driving section that drives the head holding section and the held single nozzle head or the held multiple nozzle head between the supply position and the board held at a fixed position;
   wherein the pickup/mounting driving device, when making the suction nozzle of the held single nozzle head perform mounting of the component, cuts off the suction nozzle from a negative pressure source, connects the suction nozzle to a positive pressure source, and connects the suction nozzle to the atmosphere,
   wherein the pickup/mounting driving section includes
      a negative pressure valve, provided on a negative pressure supply passage that connects the suction nozzle of the held single nozzle head and the selected suction nozzle of the held multiple nozzle head to the negative pressure source, that selectively connects the suction nozzle to the negative pressure source or the atmosphere,
      a single-use positive pressure valve, provided on a single-use positive pressure supply passage that connects the suction nozzle of the held single nozzle head to the positive pressure source, that connects the suction nozzle of the single nozzle head to the positive pressure source and cuts off the suction nozzle of the single nozzle head from the positive pressure, and
      a multiple-use positive pressure valve, provided on a multiple-use positive supply passage that connects the selected suction nozzle of the held multiple nozzle head to the positive pressure source, that connects the selected suction nozzle to the positive pressure source and cuts off the selected suction nozzle from the positive pressure source, and
   wherein the multiple nozzle head includes a switching valve that connects the selected suction nozzle to the negative pressure supply passage or the multiple-use positive pressure supply passage.

8. The component transfer device of the component mounter according to claim 7,
   wherein, when the head holding section is holding the single nozzle head, the negative pressure valve connects the suction nozzle of the single nozzle head to the atmosphere, and the single-use positive pressure valve connects the suction nozzle of the single nozzle head to the positive pressure source, such that the internal pressure of the suction nozzle of the single nozzle head is raised.

* * * * *